(12) United States Patent
Kang et al.

(10) Patent No.: US 12,525,565 B2
(45) Date of Patent: Jan. 13, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Jung Jui Kang, Kaohsiung (TW); Shih-Yuan Sun, Kaohsiung (TW); Chieh-Chen Fu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 702 days.

(21) Appl. No.: 17/876,466

(22) Filed: Jul. 28, 2022

(65) Prior Publication Data

US 2024/0038712 A1 Feb. 1, 2024

(51) Int. Cl.
*H01L 23/00* (2006.01)
*H01L 21/56* (2006.01)
(Continued)

(52) U.S. Cl.
CPC ............ *H01L 24/32* (2013.01); *H01L 21/563* (2013.01); *H01L 23/3157* (2013.01); *H01L 24/16* (2013.01); *H01L 24/48* (2013.01); *H01L 24/73* (2013.01); *H01L 25/0655* (2013.01); *H01L 21/565* (2013.01); *H01L 25/0652* (2013.01); *H01L 25/0657* (2013.01); *H01L 2224/16145* (2013.01); *H01L 2224/16227* (2013.01); *H01L 2224/16238* (2013.01); *H01L 2224/26175* (2013.01); *H01L 2224/3201* (2013.01); *H01L 2224/32053* (2013.01); *H01L 2224/32054* (2013.01); *H01L 2224/32058* (2013.01); *H01L 2224/32059* (2013.01); *H01L 2224/32145* (2013.01); *H01L 2224/32225* (2013.01); *H01L 2224/48229* (2013.01); *H01L 2224/73204* (2013.01); *H01L 2224/73257* (2013.01); *H01L 2224/73265* (2013.01); *H01L 2924/1811* (2013.01); *H01L 2924/182* (2013.01);
(Continued)

(58) Field of Classification Search
CPC ......... H01L 24/32; H01L 24/16; H01L 24/48; H01L 24/73; H01L 23/3157; H01L 21/563; H01L 21/565; H01L 25/0655
USPC ................................................ 257/778, 787
See application file for complete search history.

(56) References Cited

U.S. PATENT DOCUMENTS

| 10,037,974 B2 | 7/2018 | Chien et al. |
| 11,688,634 B2 * | 6/2023 | Mehta ............... H01L 23/367 257/774 |
| 2022/0093528 A1 | 3/2022 | Hu |

* cited by examiner

*Primary Examiner* — Jasmine J Clark
(74) *Attorney, Agent, or Firm* — FOLEY & LARDNER LLP

(57) ABSTRACT

A semiconductor device package and a method of manufacturing a semiconductor device package are provided. The semiconductor device package includes a carrier, a first component, a second component, and a protective element. The first component and the second component are arranged side by side in a first direction over the carrier. The protective element is disposed over a top surface of the carrier and extending from space under the first component toward a space under the second component. The protective element includes a first portion and a second portion protruded oppositely from edges of the first component by different distances, and the first portion and the second portion are arranged in a second direction angled with the first direction.

20 Claims, 25 Drawing Sheets

(51) Int. Cl.
*H01L 23/31* (2006.01)
*H01L 25/065* (2023.01)
(52) U.S. Cl.
CPC .................. *H01L 2924/183* (2013.01); *H01L 2924/35121* (2013.01); *H01L 2924/37001* (2013.01)

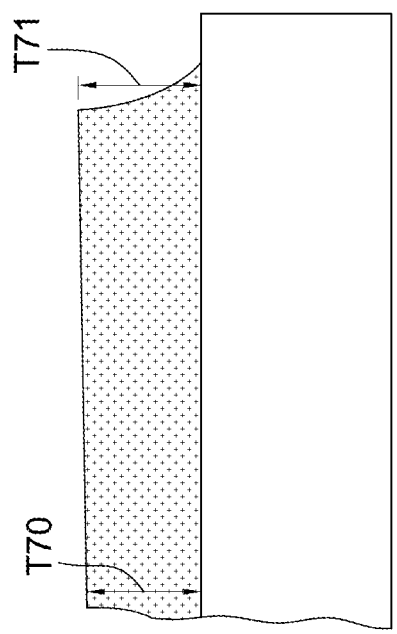
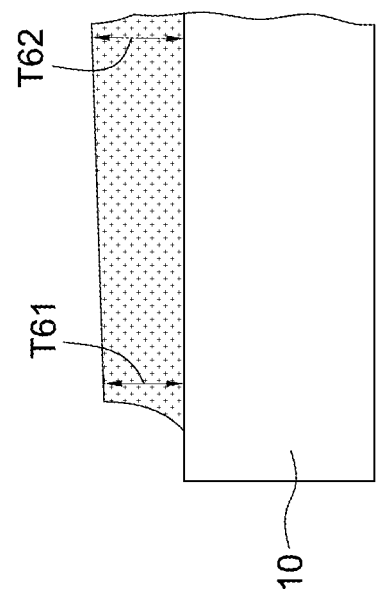
FIG. 1A-2

SEMICONDUCTOR DEVICE PACKAGE AND METHOD OF MANUFACTURING THE SAME

BACKGROUND

1. Technical Field

The present disclosure relates generally to a semiconductor device package and a method of manufacturing a semiconductor device package.

2. Description of the Related Art

Silicon photonics and optical engines with integration of at least an electronic IC (EIC) and a photonic IC (PIC) have advantages of high transmission speed and low power loss, and thus are applied in various areas. The electronic IC and the photonic IC may be arranged in a side-by-side fashion. Therefore, the transmission path between the electronic IC and the photonic IC may be relatively long. However, when the distance between the electronic IC and the photonic IC is reduced to solve the aforesaid issue, an underfill in the relatively small gap may overflow to adversely affect performance of the integrated device.

SUMMARY

In one or more embodiments, a semiconductor device package includes a carrier, a first component, a second component, and a protective element. The first component and the second component are arranged side by side in a first direction over the carrier. The protective element is disposed over a top surface of the carrier and extending from a space under the first component toward a space under the second component. The protective element includes a first portion and a second portion protruded oppositely from edges of the first component by different distances, and the first portion and the second portion are arranged in a second direction angled with the first direction.

In one or more embodiments, a semiconductor device package includes a carrier, a photonic component, an electronic component, and a protective element. The photonic component and the electronic component are arranged side by side over the carrier. The protective element includes a first portion covering a portion of the photonic component and a second portion covering a portion of the electronic component. The first portion has a thickness extending from a top surface of the carrier to a top surface of the first portion, the second portion has a thickness extending from the top surface of the carrier to a top surface of the second portion, and the thickness of the first portion is less than the thickness of the second portion.

In one or more embodiments, method of manufacturing a semiconductor device package includes bonding a first component and a second component to a carrier, wherein the first component and the second component are arranged side by side in a first direction; and applying a protective material over the carrier substantially along the first direction. The protective material includes a first portion adjacent to the first component and a second portion adjacent to the second component, and an amount of the first portion is less than an amount of the second portion.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A-1 is a cross-section of a semiconductor device package in accordance with some embodiments of the present disclosure;

FIG. 1A-2 is a cross-section of a semiconductor device package in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
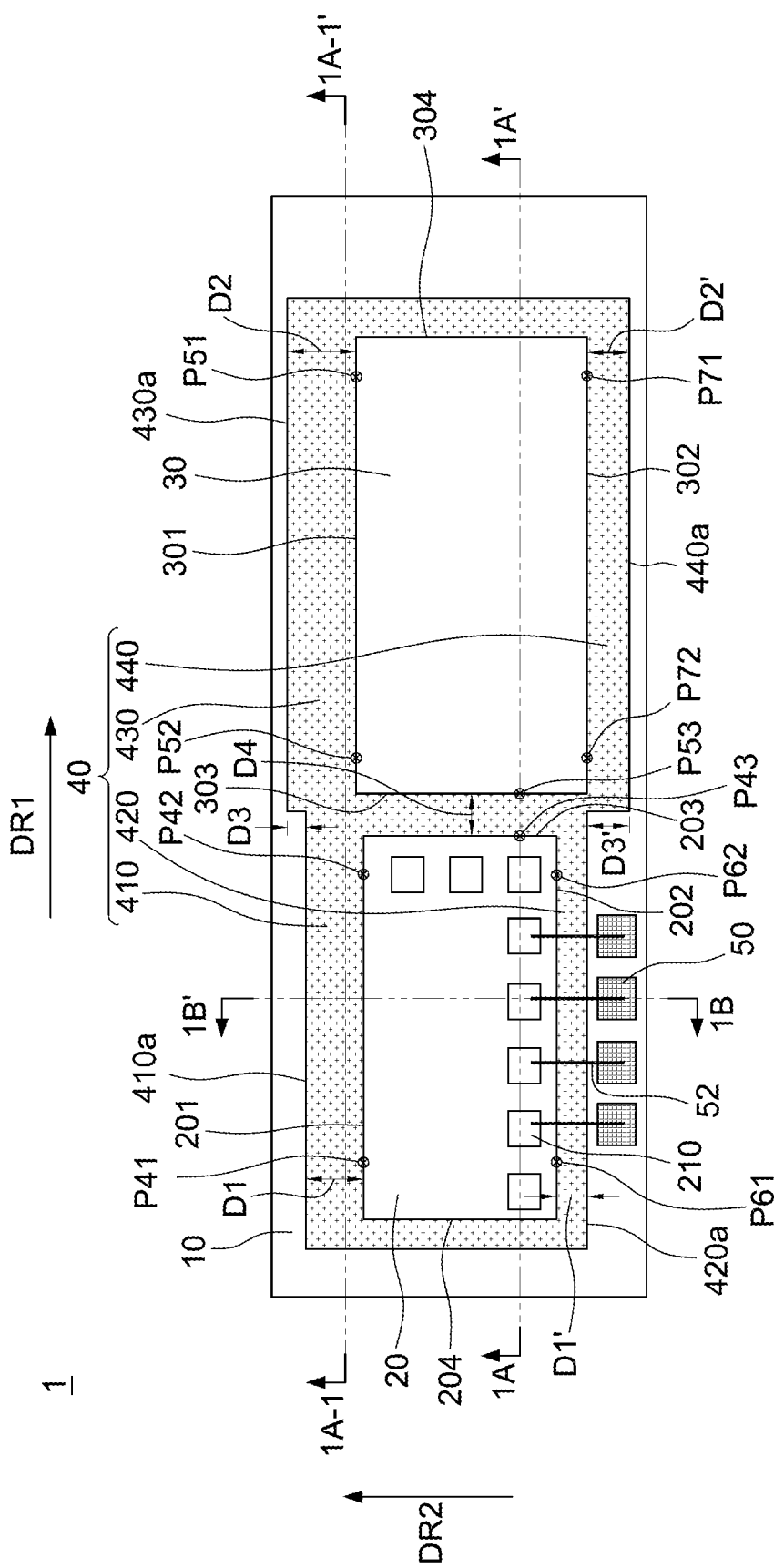
FIG. 1 is a top view of a semiconductor device package in accordance with some embodiments of the present disclosure.

FIG. 1 is a top view of a semiconductor device package 1 in accordance with some embodiments of the present disclosure. The semiconductor device package 1 includes a carrier 10, components 20 and 30, a protective element 40, conductive pads 50 and 210, and one or more bonding wires 52.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, which may include such as a plurality of conductive traces and/or a plurality of conductive vias. The interconnection structure may include a redistribution layer (RDL) and/or a grounding element. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface (or a top surface) and a lower surface (or a bottom surface) of the carrier 10. The conductive material and/or structure may include a plurality of traces. The carrier 10 may include one or more conductive pads in proximity to, adjacent to, or embedded in and exposed by an upper surface and/or a lower surface of the carrier 10. The carrier 10 may include a solder resist (not shown in FIG. 1) on the upper surface and/or the lower surface of the carrier 10 to fully expose or to expose at least a portion of the conductive pads for electrical connection.

The component 20 may be disposed over the carrier 10. In some embodiments, the component 20 is flip-chip bonded to the carrier 10. In some embodiments, a portion of the component 20 protrudes outwards from an edge of the carrier 10. The component 20 may have an edge 201, an edge 202 opposite to the edge 201, and edges 203 and 204 extending between the edge 201 and the edge 202. In some embodiments, the component 20 includes a photonic component, such as a photonic IC (PIC).

The component 30 may be disposed over the carrier 10. In some embodiments, the component 30 is flip-chip bonded to the carrier 10. In some embodiments, the components 20 and 30 are arranged side by side in a direction (or along an orientation) DR1 over the carrier 10. In some embodiments, the component 20 is spaced apart from the component 30 by a distance D4. The component 30 may have an edge 301, an edge 302 opposite to the edge 301, and edges 303 and 304 extending between the edge 301 and the edge 302. In some embodiments, the component 20 is adjacent to the edge 303 of the component 30. In some embodiments, the component 30 includes an electronic component, such as an electronic IC (EIC). In some embodiments, the component 30 includes a digital signal processor (DSP), a transimpedance amplifier (TIA), a driver (DRV), or a combination thereof.

The protective element 40 may be disposed over the carrier 10. In some embodiments, the protective element 40 is between the component 20 and the carrier 10. In some embodiments, the protective element 40 is between the component 30 and the carrier 10. In some embodiments, the protective element 40 includes a portion covering a portion of the component 20. In some embodiments, the protective element 40 includes a portion covering a portion of the component 30. In some embodiments, the protective element 40 have at least some portions having different thicknesses at different locations (e.g., locations P41, P42, P43, P51, P52, P53, P61, P62, P71, and P72). The protective element 40 may be or include an encapsulant. The protective element 40 may include an epoxy resin having fillers, a molding compound (e.g., an epoxy molding compound or other molding compound), polyimide, a phenolic compound or material, a material with a silicone dispersed therein, or a combination thereof.

In some embodiments, the protective element 40 includes portions 410 and 420 that protrude oppositely from edges of the component 20 by different distances. In some embodiments, the portions 410 and 420 of the protective element 40 are arranged in a direction (or along an orientation) DR2 angled with the direction DR1. In some embodiments, the direction DR1 is substantially perpendicular to the direction DR2. In some embodiments, the direction DR2 may be substantially parallel with the direction DR1 in a top view perspective. In some embodiments, the portion 410 protrudes outwards from the edge 201 of the component 20 towards an edge of the carrier 10 by a distance D1, and the portion 420 protrudes outwards from the edge 202 of the component 20 towards an edge of the carrier 10 by a distance D1' different from the distance D1. In some embodiments, the distance D1' is less than the distance D1. According to some embodiments, with the design of the distance D1' is less than the distance D1, components or elements that are arranged adjacent to the edge 202 of the component 20 can be prevented from being contacting the protective element 40. For example, conductive pads 50 can be free from contacting the protective element 40. Therefore, the yield of the semiconductor device package can be improved.

In some embodiments, the protective element 40 includes portions 430 and 440 that protrude oppositely from edges of the component 30 by different distances. In some embodiments, the portions 430 and 440 of the protective element 40 are arranged in the direction DR2. In some embodiments, the portion 430 protrudes outwards from the edge 301 of the component 30 towards an edge of the carrier 10 by a distance D2, and the portion 440 protrudes outwards from the edge 302 of the component 30 towards an edge of the carrier 10 by a distance D2' different from the distance D2. In some embodiments, the distance D2' is less than the distance D2.

In some embodiments, the portion 410 and the portion 430 of the protective element 40 are arranged side by side, and the distance D1 is less than the distance D2. In some embodiments, the portion 410 of the protective element 40 protrudes outwards from a left edge (e.g., the edge 201) of the component 20 towards a left edge of the carrier 10 by a first distance (e.g., the distance D1), and the portion 430 of the protective element 40 protrudes outwards from a right edge (e.g., the edge 301) of the component 30 towards a right edge of the carrier 10 by a second distance (e.g., the distance D2) greater than the first distance (e.g., the distance D1). In some embodiments, the portion 420 and the portion 440 of the protective element 40 are arranged side by side, and the distance D1' is less than the distance D2'. In some embodiments, the portion 410 is connected to the portion 430, and the portions 410 and 430 collectively form a stepped structure. In some embodiments, an edge 410a of the portion 410 of the protective element 40 is recessed with respect to an edge 430a of the portion 430 of the protective element 40 by a step depth D3. In some embodiments, the portion 420 is connected to the portion 440, and the portions 420 and 440 collectively form a stepped structure. In some embodiments, an edge 420a of the portion 420 of the protective element 40 is recessed with respect to an edge 440a of the portion 440 of the protective element 40 by a step depth D3' different from the step depth D3. In some embodiments, the step depth D3' is greater than (or exceeds) the step depth D3.

The conductive pad 50 may be over the carrier 10. In some embodiments, the conductive pad 50 is spaced apart from the portion 420 of the protective element 40. The conductive pad 50 may include a conductive material such as a metal or metal alloy. Examples include gold (Au), silver (Ag), aluminum (Al), copper (Cu), or an alloy thereof.

The conductive pad 210 may be over the component 20. In some embodiments, the conductive pad 210 is electrically connected to the component 20. In some embodiments, the conductive pad 210 is free from contacting the protective element 40. The conductive pad 210 may include a conductive material such as a metal or metal alloy. Examples include Au, Ag, Al, Cu, or an alloy thereof.

The bonding wire 52 may be over the component 20 and the conductive pad 50. In some embodiments, the bonding wire 52 connects the conductive pad 50 to the conductive pad 210. In some embodiments, the bonding wire 52 electrically connects the component 20 to the carrier 10 by electrically connecting the conductive pad 210 to the conductive pad 50.

Figure 1A:
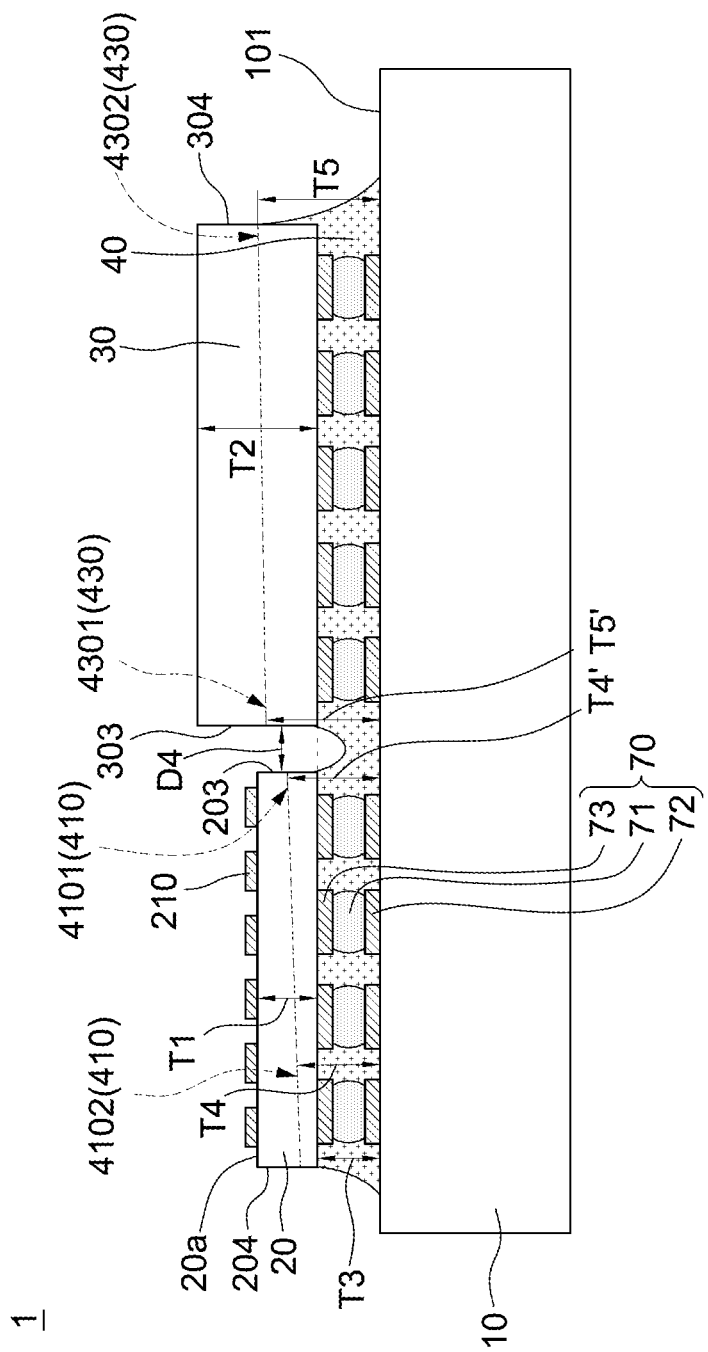
FIG. 1A is a cross-section of a semiconductor device package in accordance with some embodiments of the present disclosure.
Figures 1, 1A:
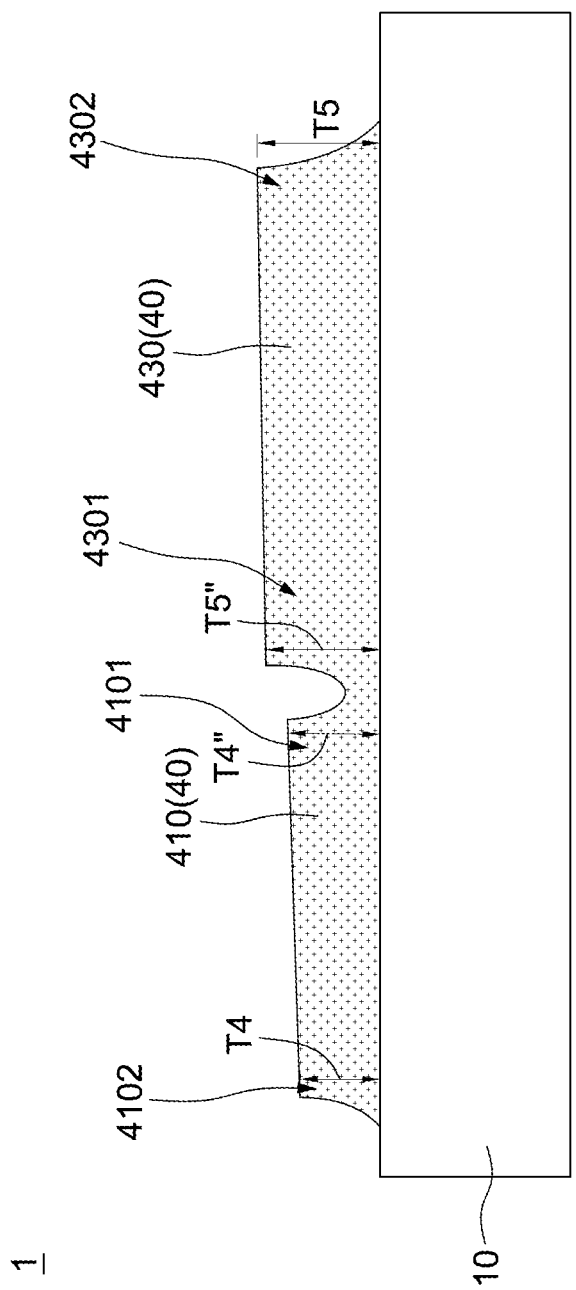

FIG. 1A is a cross-section of a semiconductor device package 1 in accordance with some embodiments of the present disclosure. In some embodiments, FIG. 1A is a cross-section along line 1A-1A' in FIG. 1.

In some embodiments, the component 20 has a thickness T1, and the component 30 has a thickness T2 different from the thickness T1. In some embodiments, the thickness T1 of the component 20 is about 80 μm to about 120 μm, or about 100 μm. In some embodiments, the thickness T2 of the component 30 is about 600 μm to about 800 μm, or about 700 μm.

In some embodiments, the semiconductor device package 1 further includes a plurality of conductive connection elements 70 between the carrier 10 and the component 20. In some embodiments, the conductive connection elements 70 are further disposed between the carrier 10 and the component 30. In some embodiments, the conductive connection elements 70 are on the carrier 10. In some embodiments, the protective element 40 covers or encapsulates the conductive connection elements 70. In some embodiments, the conductive connection element 70 has a thickness T3. In some embodiments, the thickness T3 of the conductive connection element 70 is about 65 μm to about 90 μm, or about 75 μm to about 80 μm. In some embodiments, a ratio (D4/T3) of the distance D4 between the component 20 and the component 30 to the thickness T3 of the conductive connection element 70 is less than about 10, about 8, about 7, about 6, or about 5. In some embodiments, the conductive connection element 70 includes one or more conductive bumps, one or more conductive pads, one or more under bump metals (UBMs), one or more solder balls, one or more conductive studs, or a combination thereof. For example, the conductive connection element 70 may include conductive pads 72 and 73 and a solder ball 71 disposed between and connected to the conductive pads. In some embodiments, the conductive connection element 70 may include Ag, Al, Cu, or an alloy thereof.

According to some embodiments of the present disclosure, the conductive connection elements 70 including solders or soldering materials (e.g., the solder balls 71) may be configured to self-align the components 20 and 30 to the carrier 10. With the conductive pads 72 pre-formed on predetermined positions of the carrier 10 and the conductive pads 73 pre-formed on predetermined positions of the components 20 and 30, the solders 71 may serve to align the components 20 and 30 to the carrier 10 by self-aligning the conductive pads 73 to the conductive pads 72 when the solders 71 are melted during bonding. Thus, the alignment accuracy of the components 20 and 30 to the carrier 10 can be increased, and thereby the adjustment of the distance D4 between the component 20 and the component 30 can be controlled with relatively high accuracy so as to significantly reduce the distance D4 without the components 20 and 30 colliding to each other. Therefore, the size of the semiconductor device package 1 can be further reduced without damaging the components 20 and 30.

In some embodiments, the component 20 is separated from the carrier 10 by a distance which may be defined by the thickness T3 of the conductive connection element 70. In some embodiments, a ratio (D4/T3) of the distance D4 between the component 20 and the component 30 to the distance (e.g., the thickness T3) between the component 20 and the carrier 10 is less than about 10, about 8, about 7, about 6, or about 5. In some embodiments, the conductive pads 210 are disposed over a top surface 20a of the component 20.

In some embodiments, the portion 410 of the protective element 40 may have different parts having different thicknesses. In some embodiments, the portion 410 includes a part 4101 that is adjacent to the component 30 and has a thickness T4', the portion 410 includes a part 4102 that is distal from the component 30 and has a thickness T4, and the thickness T4' is greater than the thickness T4. In some embodiments, the amount of the protective material for forming the portion 410 is less than the amount of the protective material for forming the portion 430, and the protective materials may flow before being cured, thus the amounts of the as-formed portion 410 and the as-formed portion 430 are different. Therefore, the thickness T4 is greater than the thickness T4.

In some embodiments, the portion 430 of the protective element 40 may have different parts having different thicknesses. In some embodiments, the portion 430 includes a part 4301 that is adjacent to the component 20 and has a thickness T5', the portion 430 includes a part 4302 that is distal from the component 20 and has a thickness T5, and the thickness T5' is less than the thickness T5. In some embodiments, the amount of the protective material for forming the portion 410 is less than the amount of the protective material for forming the portion 430, and the protective materials may flow before being cured, thus the amounts of the as-formed portion 410 and the as-formed portion 430 are different. Therefore, the thickness T5 is greater than the thickness T5'.

In some embodiments, the part 4101 of the portion 410 is adjacent to an edge (e.g., the edge 203) of the component 20, the part 4301 of the portion 430 is adjacent to an edge (e.g., the edge 303) of the component 30, and the thickness T5' of the part 4301 of the portion 430 is greater than the thickness T4' of the part 4101 of the portion 410.

In some embodiments, referring to FIG. 1, the protective element 40 may have the thickness T4 at the location P41, and the protective element 40 may have the thickness T4' at the location P43. In some embodiments, referring to FIG. 1, the protective element 40 may have the thickness T5 at the location P51, and the protective element 40 may have the thickness T5' at the location P53.

FIG. 1A-1 is a cross-section of a semiconductor device package 1 in accordance with some embodiments of the present disclosure. In some embodiments, FIG. 1A-1 is a cross-section along line 1A-1-1A-1' in FIG. 1.

In some embodiments, referring to FIG. 1A and FIG. 1A-1, the protective element 40 is over a surface 101 (or a top surface) of the carrier 10 and extends from below the component 20 toward below the component 30. In some embodiments, the portion 410 of the protective element 40 has a thickness T4, the portion 430 of the protective element 40 has a thickness T5, and the thickness T4 is less than the thickness T5. In some embodiments, the thickness T4 of the portion 410 of the protective element 40 is greater than (or exceeds) the thickness T3 of the conductive connection element 70. In some embodiments, the thickness T4 is defined by a distance between a bottom surface and a top surface of the portion 410, and the thickness T5 is defined by a distance between a bottom surface and atop surface of the portion 430. In some embodiments, the thickness T4 is defined by a distance between the surface 101 (or the top surface) of the carrier 10 and a top surface of the portion 410, and the thickness T5 is defined by a distance between the surface 101 of the carrier 10 and a top surface of the portion 430. In some embodiments, referring to FIG. 1, the protective element 40 may have the thickness T4" at the location P42, and the protective element 40 may have the thickness T5" at the location P52. In some embodiments, the part 4101 of the portion 410 that is adjacent to the component 30 may have the thickness T4". In some embodiments, the part 4301 of the portion 430 that is adjacent to the component 20 may have the thickness T5".

FIG. 1A-2 is a cross-section of a semiconductor device package 1 in accordance with some embodiments of the present disclosure. In some embodiments, FIG. 1A-2 shows cross-sections illustrating portions of the structure in FIG. 1 in a direction substantially parallel to the direction DR1.

In some embodiments, referring to FIG. 1, the protective element 40 may have the thickness T61 at the location P61, and the protective element 40 may have the thickness T62 at the location P62. In some embodiments, referring to FIG. 1, the protective element 40 may have the thickness T71 at the location P71, and the protective element 40 may have the thickness T72 at the location P72.

In some embodiments, the amount of the protective material for forming the portion 410 is less than the amount of the protective material for forming the portion 430, and the protective materials may flow before being cured, thus the amounts of the as-formed portions 410, 420, 430, and 440 are different. In some embodiments, the amount of the portion 430 is greater than the amount of the portion 410. In some embodiments, the amount of the portion 440 is equal to or greater than the amount of the portion 420. In some embodiments, the amount of the portion 410 is greater than the amount of the portion 420. In some embodiments, the amount of the portion 430 is greater than the amount of the portion 440. In some embodiments, these difference in amounts of portions 410, 420, 430, and 440 of the protective element 40 may cause the differences in thicknesses at different locations of the protective element 40.

In some embodiments, referring to FIGS. 1, FIG. 1A, FIG. 1A-1, and FIG. 1A-2, the thickness of the protective element 40 at the location P42 is greater than the thickness of the protective element 40 at the location P41, the thickness of the protective element 40 at the location P41 is greater than the thickness of the protective element 40 at the location P62, and the thickness of the protective element 40 at the location P62 is equal to or greater than the thickness of the protective element 40 at the location P61. In some embodiments, referring to FIGS. 1, FIG. 1A, FIG. 1A-1, and FIG. 1A-2, the thickness of the protective element 40 at the location P51 is greater than the thickness of the protective element 40 at the location P52, the thickness of the protective element 40 at the location P52 is greater than the thickness of the protective element 40 at the location P71, and the thickness of the protective element 40 at the location P71 is equal to or greater than the thickness of the protective element 40 at the location P72.

Figure 1B:
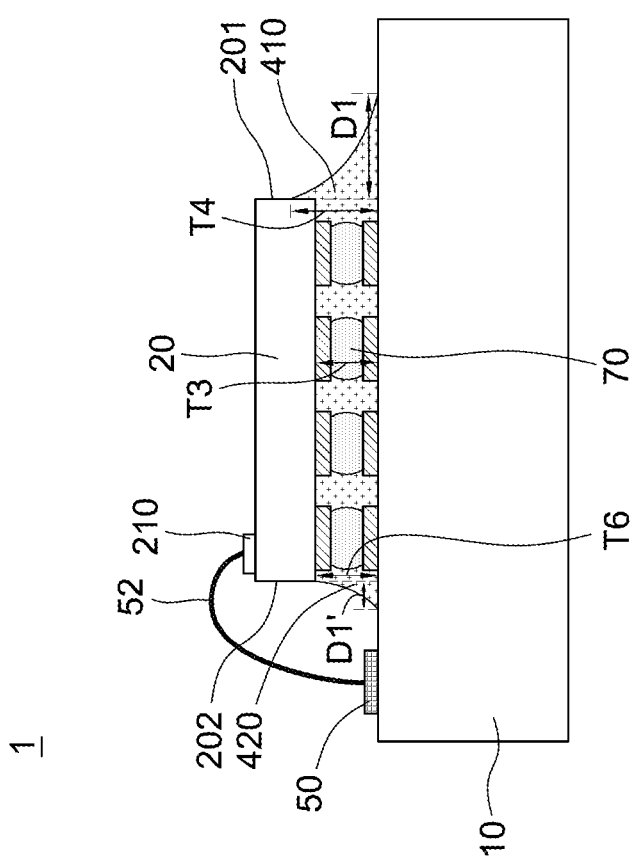
FIG. 1B is a cross-section of a semiconductor device package in accordance with some embodiments of the present disclosure.

FIG. 1B is a cross-section of a semiconductor device package 1 in accordance with some embodiments of the present disclosure. In some embodiments, FIG. 1B is a cross-section along line 1B-1B' in FIG. 1.

In some embodiments, the portion 410 of the protective element 40 covers a portion of the component 20. In some embodiments, the portion 410 of the protective element 40 covers a portion of the edge 201 (or surface) of the component 20. In some embodiments, the portion 420 of the protective element 40 has a thickness T6 substantially the same as the distance T3 between the component 20 and the carrier 10. In some embodiments, the thickness T6 of the portion 420 of the protective element 40 is defined by a distance between a bottom surface and a top surface (e.g., a topmost surface) of the portion 420. In some embodiments, the thickness T6 of the portion 420 of the protective element 40 is defined by a distance extending from the surface 101 of the carrier 10 to a top surface (e.g., a topmost surface) of the portion 420. In some embodiments, the thickness T6 of the portion 420 is less than the thickness (e.g., the thicknesses T5 and T5') of the portion 430. In some embodiments, the thickness (e.g., the thicknesses T4 and T4') of the portion 410 is less than the thickness T6 of the portion 420.

In some embodiments, the protective element 40 (e.g., the portion 410 of the protective element 40) has a concave surface. In some embodiments, while the amount of the material(s) for forming the protective element 40 is appropriate enough to fill the gap under the component 20, the protective element 40 is formed with a concave surface extending between the component 20 and the carrier 10.

Figure 1C:
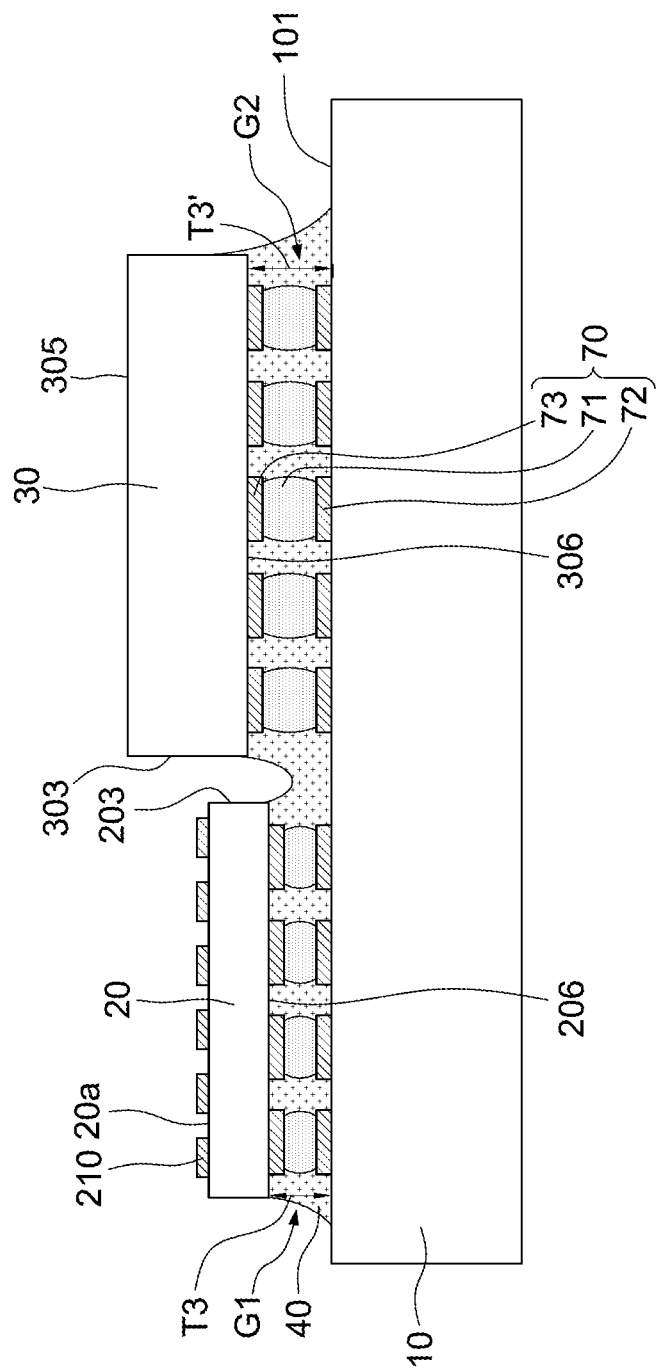
FIG. 1C is a cross-section of a semiconductor device package in accordance with some embodiments of the present disclosure.

FIG. 1C is a cross-section of a semiconductor device package 1 in accordance with some embodiments of the present disclosure. In some embodiments, FIG. 1C is a cross-section along line 1A-1A' in FIG. 1.

In some embodiments, a gap G1 defined by the carrier 10 and the component 20 is smaller than a gap G2 defined by the carrier 10 and the component 30. In some embodiments, a distance T3 defined by the surface 101 of the carrier 10 and a bottom surface 206 of the component 20 is less than a distance T3' defined by the surface 101 of the carrier 10 and a bottom surface 306 of the component 30. In some embodiments, an elevation of the bottom surface 306 of the component 30 is between an elevation of the top surface 20a of the component 20 and an elevation of the bottom surface 206 of the component 20.

Figure 1D:
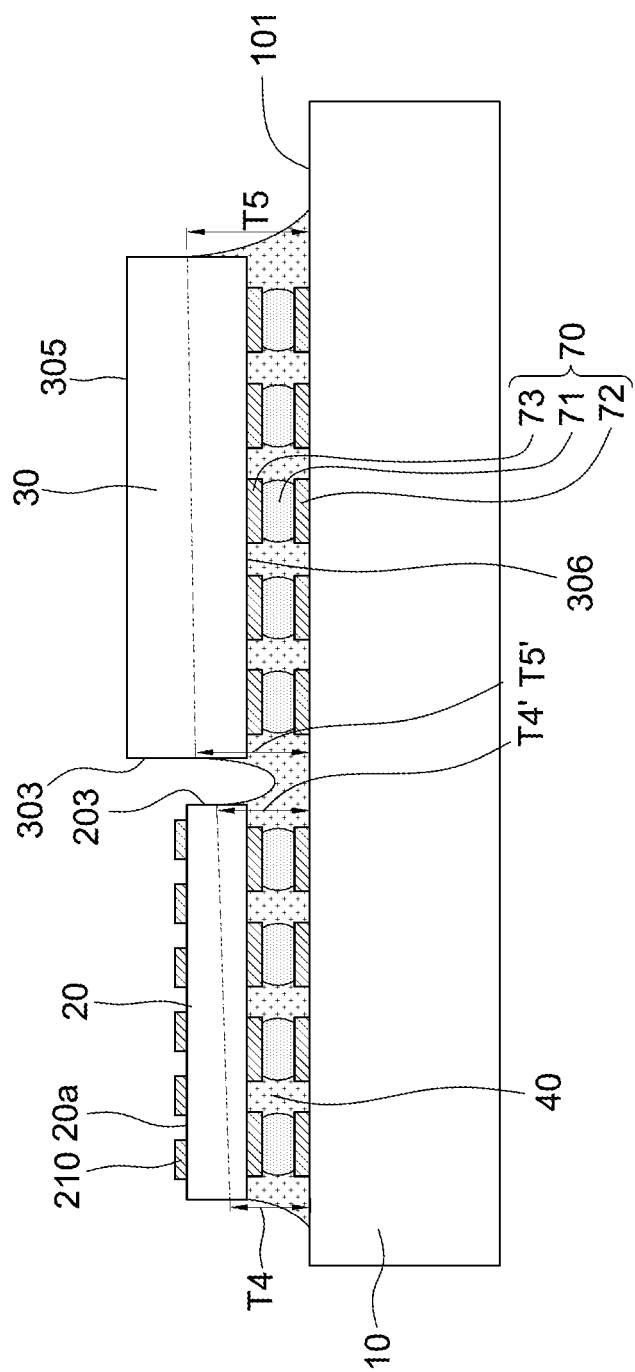
FIG. 1D is a cross-section of a semiconductor device package in accordance with some embodiments of the present disclosure.

FIG. 1D is a cross-section of a semiconductor device package 1 in accordance with some embodiments of the present disclosure. In some embodiments, FIG. 1D is a cross-section along line 1A-1A' in FIG. 1.

In some embodiments, the protective element 40 covers a portion of the edge 203 of the component 20 and a portion of the edge 303 of the component 30. In some embodiments, the thickness T5' is greater than the thickness T4'.

Figure 2A:
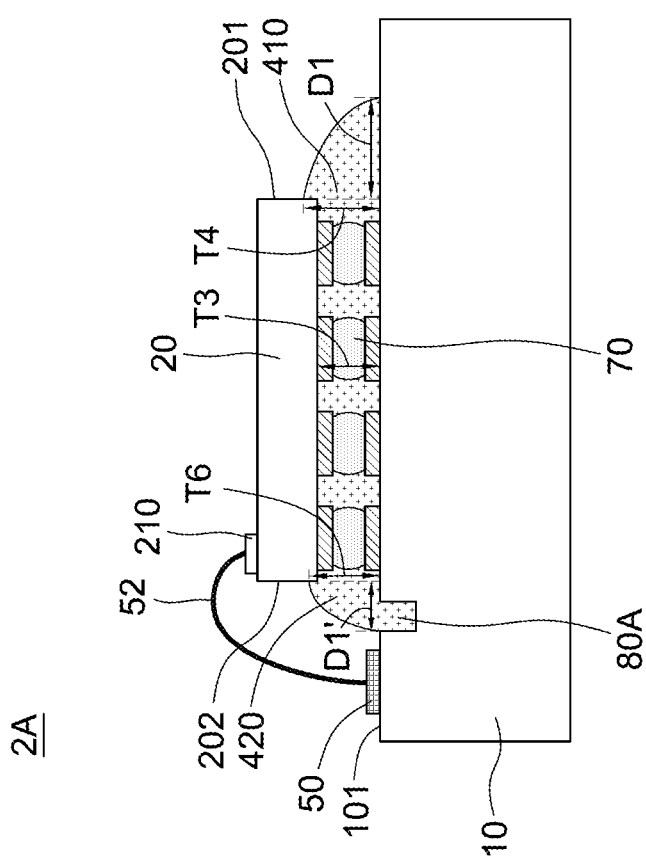
FIG. 2A is a cross-section of a semiconductor device package in accordance with some embodiments of the present disclosure.

FIG. 2A is a cross-section of a semiconductor device package 2A in accordance with some embodiments of the present disclosure. In some embodiments, the semiconductor device package 1 may have a structure as illustrated in FIG. 2A.

In some embodiments, the portion 410 of the protective element 40 covers a portion of the component 20. In some embodiments, the portion 410 of the protective element 40 partially covers the edge 201 of the component 20. In some embodiments, the thickness T4 of the portion 410 is greater than (or exceeds) a distance between the component 20 and the carrier 10. In some embodiments, the portion 420 of the protective element 40 covers a portion of the component 20. In some embodiments, the portion 420 of the protective element 40 partially covers the edge 202 of the component 20. In some embodiments, a thickness T6 of the portion 420 is greater than (or exceeds) a distance between the component 20 and the carrier 10. In some embodiments, the thickness T4 of the portion 410 is greater than (or exceeds) the thickness T6 of the portion 420. In some embodiments, the protective element 40 (e.g., the portion 410 of the protective element 40) has a convex surface. In some embodiments, while the amount of the material(s) for forming the protective element 40 is relatively large, the protective element 40 may be formed with a convex surface extending between the component 20 and the carrier 10.

In some embodiments, the semiconductor device package 2A further includes a blocking structure 80A. In some embodiments, the blocking structure 80A spaces the at least one conductive pad 50 apart from the portion 420 of the protective element 40. In some embodiments, the blocking structure 80A is recessed from a top surface 101 of the carrier 10. In some embodiments, the blocking structure 80A is or includes a trench recessed from the top surface 101 of the carrier 10. In some embodiments, a portion of the portion 420 of the protective element 40 is filled in the trench (i.e., the blocking structure 80A). In some embodiments, the blocking structure 80A contacts the portion 420 of the protective element 40.

According to some embodiments of the present disclosure, the blocking structure 80A can prevent the material of the protective element 40 (e.g., an encapsulant material) from overflowing to contact the at least one conductive pad 50 during manufacture of the semiconductor device package. The excess material may flow and fill in the trench of the blocking structure 80A, and thus the at least one conductive pad 50 can be free from contacting the protective element 40. Therefore, the yield of the semiconductor device package can be improved.

Figure 2B:
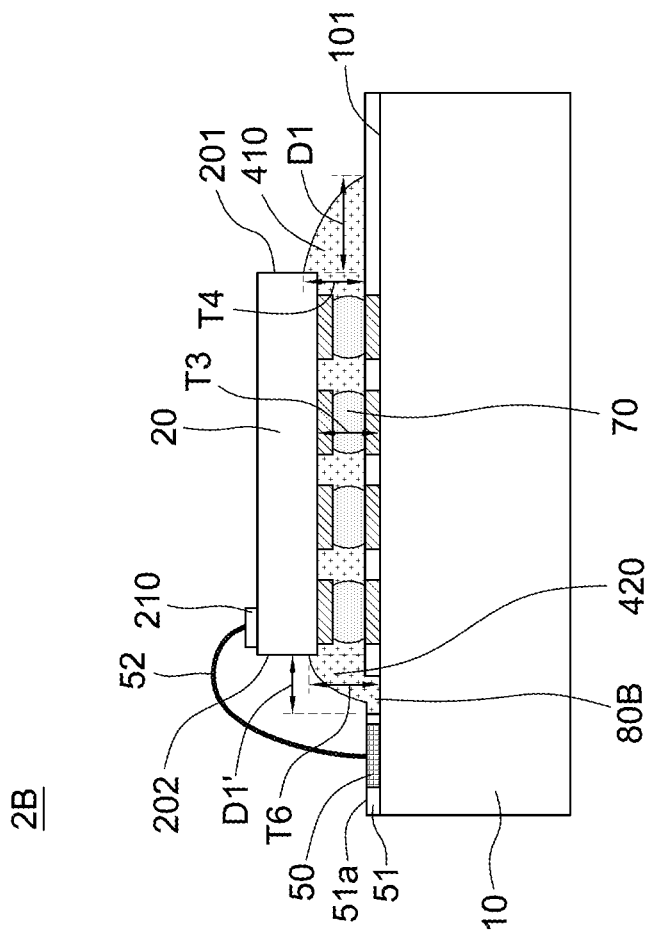
FIG. 2B is a cross-section of a semiconductor device package in accordance with some embodiments of the present disclosure.

FIG. 2B is a cross-section of a semiconductor device package 2B in accordance with some embodiments of the present disclosure. In some embodiments, the semiconductor device package 1 may have a structure as illustrated in FIG. 2B. The semiconductor device package 2B is similar to the semiconductor device package 2A in FIG. 2A, with differences therebetween as follows.

In some embodiments, the semiconductor device package 2B further includes a blocking structure 80B. In some embodiments, the blocking structure 80B spaces the at least one conductive pad 50 apart from the portion 420 of the protective element 40. In some embodiments, the carrier 10 includes a solder resist layer 51 over the top surface 101 of the carrier 10. In some embodiments, the blocking structure 80B is recessed from a top surface 51a of the solder resist layer 51. In some embodiments, the blocking structure 80B is or includes a trench recessed from the top surface 51a of the solder resist layer 51. The solder resist layer 51 may include a plurality of openings exposing portions of the top surface 101 of the carrier 10. In some embodiments, the at least one conductive pad 50 may be disposed in one or some of the openings. In some embodiments, at least one of the openings forms the blocking structure 80B. In some embodiments, the solder resist layer 51 defines the blocking structure 80B. In some embodiments, a portion of the portion 420 of the protective element 40 is filled in the trench (i.e., the blocking structure 80B). In some embodiments, the blocking structure 80B contacts the portion 420 of the protective element 40.

According to some embodiments of the present disclosure, the blocking structure 80B can prevent the material of the protective element 40 (e.g., an encapsulant material) from overflowing to contact the at least one conductive pad 50 during manufacture of the semiconductor device package. The excess material may flow and fill in the trench of the blocking structure 80B defined by the solder resist layer 51, and thus the at least one conductive pad 50 can be free from contacting the protective element 40. Therefore, the yield of the semiconductor device package can be improved.

Figure 2C:
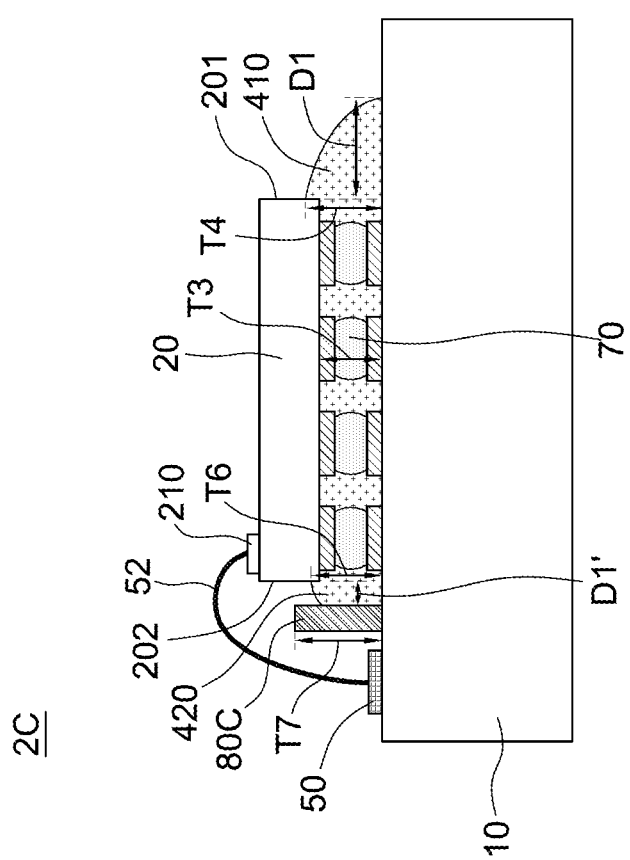
FIG. 2C is a cross-section of a semiconductor device package in accordance with some embodiments of the present disclosure.

FIG. 2C is a cross-section of a semiconductor device package 2C in accordance with some embodiments of the present disclosure. In some embodiments, the semiconductor device package 1 may have a structure as illustrated in FIG. 2C. The semiconductor device package 2C is similar to the semiconductor device package 2A in FIG. 2A, with differences therebetween as follows.

In some embodiments, the semiconductor device package 2C further includes a blocking structure 80C. In some embodiments, the blocking structure 80C includes a wall structure. In some embodiments, the blocking structure 80C spaces the at least one conductive pad 50 apart from the portion 420 of the protective element 40. In some embodiments, the blocking structure 80C contacts the portion 420 of the protective element 40. In some embodiments, the block structure 80C has a thickness T7 (or height) greater than a distance between the component 20 and the carrier 10. In some embodiments, the blocking structure 80C is electrically isolated or insulated from the conductive pads 50 and 210 and the conductive connection elements 70. The blocking structure 80C may be formed of or include a dielectric material, a ceramic material, metal or metal alloy, a combination thereof, or the like.

According to some embodiments of the present disclosure, the blocking structure 80C can prevent the material of the protective element 40 (e.g., an encapsulant material) from overflowing to contact the at least one conductive pad 50 during manufacture of the semiconductor device package. The excess material may flow and be stopped by the wall structure of the blocking structure 80C, and thus the at least one conductive pad 50 can be free from contacting the protective element 40. Therefore, the yield of the semiconductor device package can be improved.

Figure 3A:
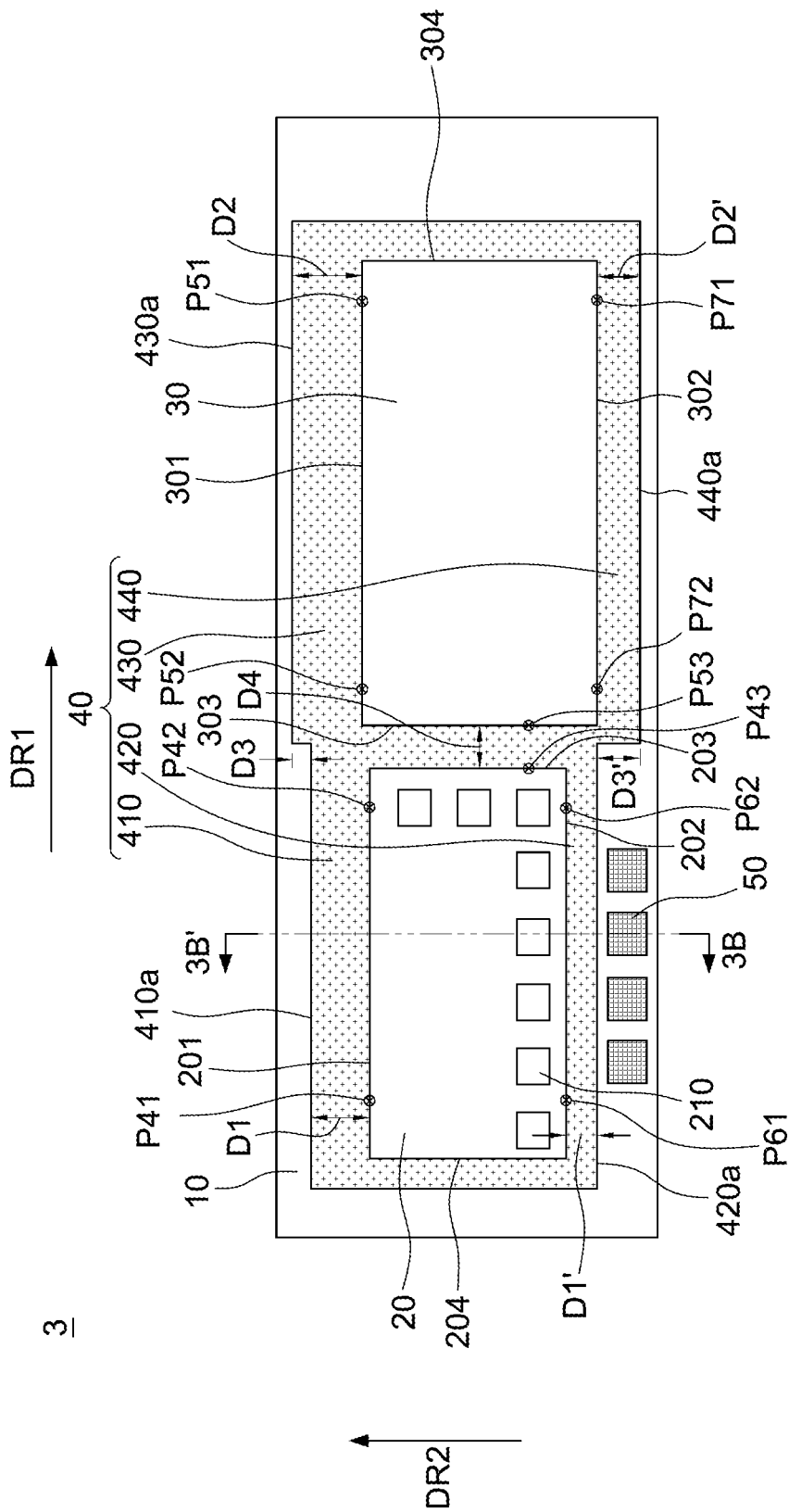
FIG. 3A is a top view of a semiconductor device package in accordance with some embodiments of the present disclosure.

FIG. 3A is a top view of a semiconductor device package 3 in accordance with some embodiments of the present disclosure. The semiconductor device package 3 is similar to the semiconductor device package 1 in FIG. 1, with differences therebetween as follows.

In some embodiments, the semiconductor device package 3 does not include bonding wires 52. In some embodiments, the conductive pad 50 is not electrically connected to the conductive pad 210 through bonding wires. The conductive pad 50 may serve as a test pad for the carrier 10. The conductive pad 210 may serve as a test pad for the component 20.

Figure 3B:
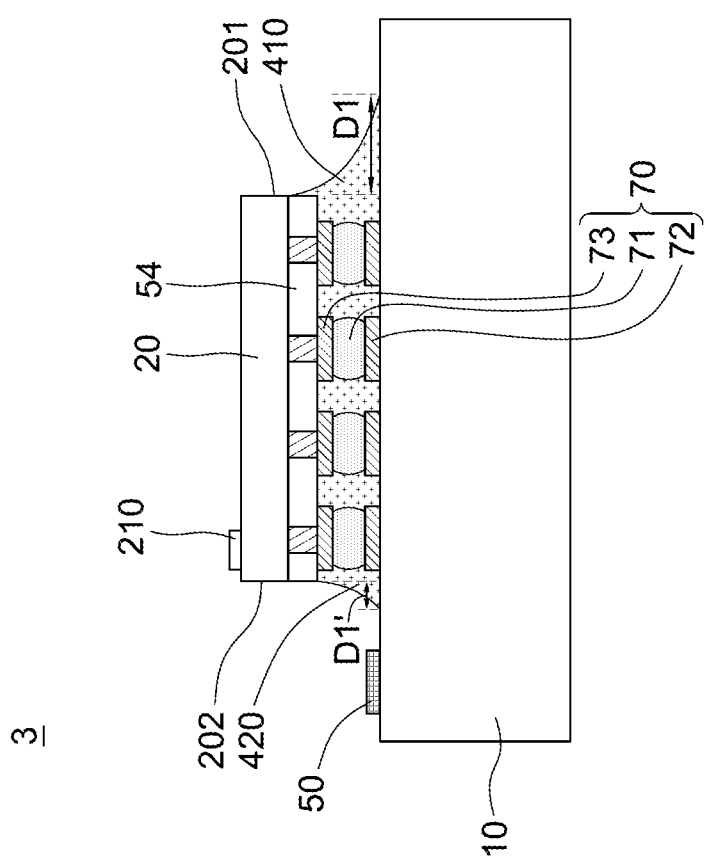
FIG. 3B is a cross-section of a semiconductor device package in accordance with some embodiments of the present disclosure.

FIG. 3B is a cross-section of a semiconductor device package 3 in accordance with some embodiments of the present disclosure. In some embodiments, FIG. 3B is a cross-section along line 3B-3B' in FIG. 3A.

In some embodiments, the semiconductor device package 3 further includes an interposer 54 electrically connected to the carrier 10. In some embodiments, the interposer 54 electrically connects the component 20 to the carrier 10 through the conductive connection elements 70. In some embodiments, the interposer 54 includes a plurality of through silicon vias (TSVs) penetrating the interposer 54 to electrically connect to the conductive connection elements 70. In some embodiments, the TSVs of the interposer 54 electrically connect the component 20 to the carrier 10.

According to some embodiments of the present disclosure, the conductive connection elements 70 including solders or soldering materials (e.g., the solder balls 71) may be configured to self-align the interposer 54 to the carrier 10. With the conductive pads 72 pre-formed on predetermined positions of the carrier 10 and the conductive pads 73 pre-formed on predetermined positions corresponding to the TSVs of the interposer 54, the solders 71 may serve to align the interposer 54 to the carrier 10 by self-aligning the conductive pads 73 to the conductive pads 72 when the solders 71 are melted during bonding. Thus, since the component 20 is connected to the interposer 54, similar to the situation illustrated in the embodiments of FIG. 1, the alignment accuracy of component 20 and the component 30 to the carrier 10 can be increased, and thereby the adjustment of the distance D4 between the component 20 and the component 30 can be controlled with a relatively high accuracy so as to be significantly reduce the distance D4 without the components 20 and 30 colliding. Therefore, the size of the semiconductor device package can be further reduced without damaging the components 20 and 30.

In addition, according to some embodiments of the present disclosure, with the design of the interposer 54, the component 20 can be disposed over the interposer 54 so as to raise the elevation of the component 20. Therefore, it can prevent the material of the protective element 40 (e.g., an encapsulant material) from overflowing over the component 20 and covering the conductive pads 210 during manufacture of the semiconductor device package.

Figure 4:
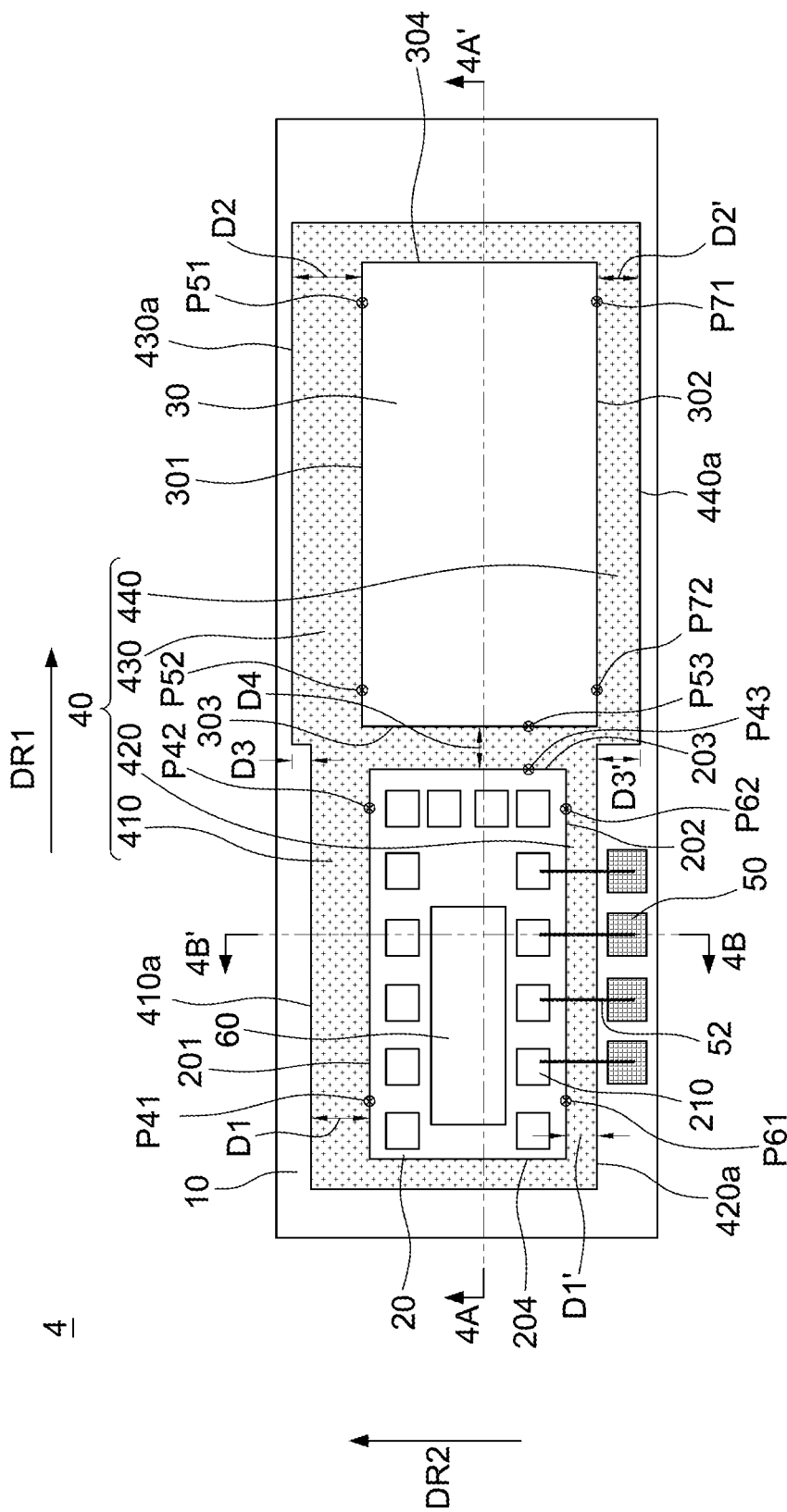
FIG. 4 is a top view of a semiconductor device package in accordance with some embodiments of the present disclosure.

FIG. 4 is a top view of a semiconductor device package 4 in accordance with some embodiments of the present disclosure. The semiconductor device package 4 is similar to the semiconductor device package 1 in FIG. 1, with differences therebetween as follows.

In some embodiments, the semiconductor device package 4 further includes a component 60 stacked over the component 20. In some embodiments, the protective element 40 is free from contacting the component 60. In some embodiments, the component 60 includes an electronic component, such as an EIC. In some embodiments, the component 30 includes a DSP, a TIA, a DRV, or a combination thereof.

Figure 4A:
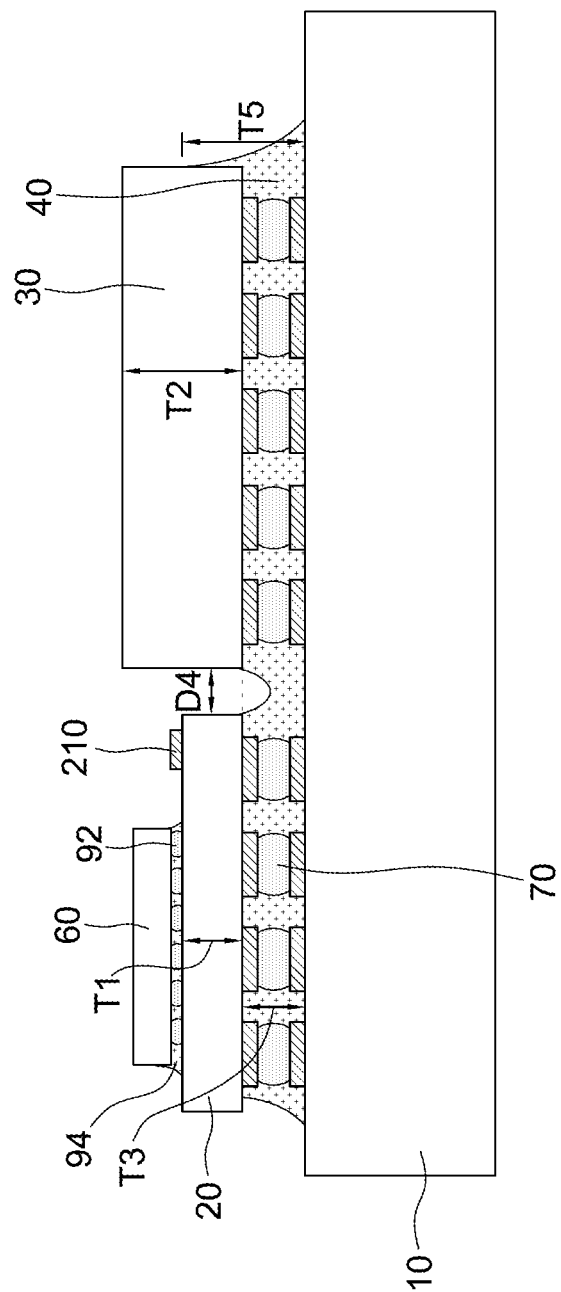
FIG. 4A is a cross-section of a semiconductor device package in accordance with some embodiments of the present disclosure.

FIG. 4A is a cross-section of a semiconductor device package 4 in accordance with some embodiments of the present disclosure. In some embodiments, FIG. 4A is a cross-section along line 4A-4A' in FIG. 4.

In some embodiments, the semiconductor device package 4 further includes a plurality of connection elements 92 between the component 20 and the component 60. The connection elements 92 may be or include conductive pads, conductive studs, conductive bumps, UBMs, or a combination thereof. In some embodiments, the semiconductor device package 4 further includes a protective element 94 covering or encapsulating the connection elements 92. In some embodiments, the protective element 40 is free from contacting the protective element 94. In some embodiments, the protective element 40 is free from contacting the conductive pads 210. The protective element 94 may be or include an encapsulant. The protective element 94 may include an epoxy resin having fillers, a molding compound (e.g., an epoxy molding compound or other molding compound), polyimide, a phenolic compound or material, a material with a silicone dispersed therein, or a combination thereof. In some embodiments, the component 20 includes a photonic component, and the components 30 and 60 include electronic components.

According to some embodiments of the present disclosure, with the design of the protective element 40 free from contacting the protective element 94, peeling between the protective element 40 and the protective element 94 resulting from contact between different encapsulant materials can be prevented. Therefore, the reliability of the semiconductor device package 4 can be increased.

Figure 4B:
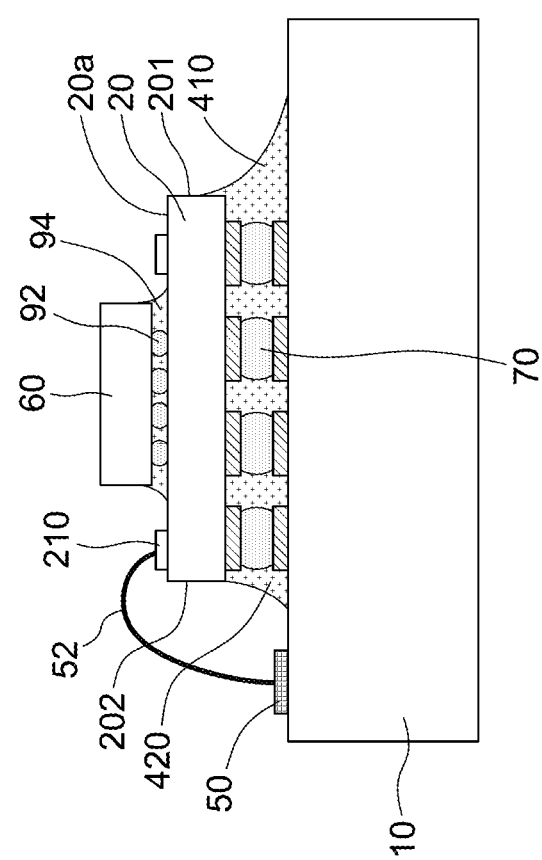
FIG. 4B is a cross-section of a semiconductor device package in accordance with some embodiments of the present disclosure.

FIG. 4B is a cross-section of a semiconductor device package 4 in accordance with some embodiments of the present disclosure. In some embodiments, FIG. 4B is a cross-section along line 4B-4B' in FIG. 4.

In some embodiments, the component 60 is stacked over the top surface 20a of the component 20. In some embodiments, the conductive pad 210 is disposed on the top surface 20a of the component 20 and adjacent to the protective element 94. In some embodiments, a top surface (or a topmost surface) of the component 60 is at an elevation higher than an elevation of a topmost surface of the bonding wire 52 with respect to the carrier 10.

Figure 4C:
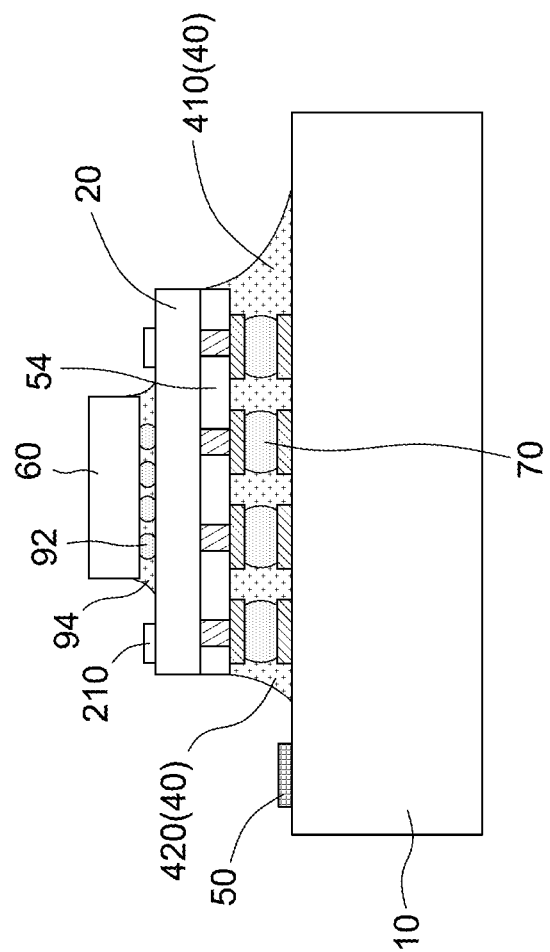
FIG. 4C is a cross-section of a semiconductor device package in accordance with some embodiments of the present disclosure.

FIG. 4C is a cross-section of a semiconductor device package 4C in accordance with some embodiments of the present disclosure. In some embodiments, the semiconductor device package 4 illustrated in FIG. 4 may have a structure without bonding wires 52, and FIG. 4C may illustrate a cross-section along line 4B-4B' of the structure without bonding wires 52.

In some embodiments, the semiconductor device package 4C further includes an interposer 54 electrically connecting the component 20 to the carrier 10 through the conductive connection elements 70. In some embodiments, the component 60 is stacked over the interposer 54. In some embodiments, the interposer 54 is between the component 60 and the carrier 10.

FIG. 5, FIG. 5A, FIG. 5B, FIG. 6, FIG. 6A, FIG. 6B, and FIG. 7 illustrate various operations in a method of manufacturing a semiconductor device package 1 in accordance with some embodiments of the present disclosure.

Figure 5:
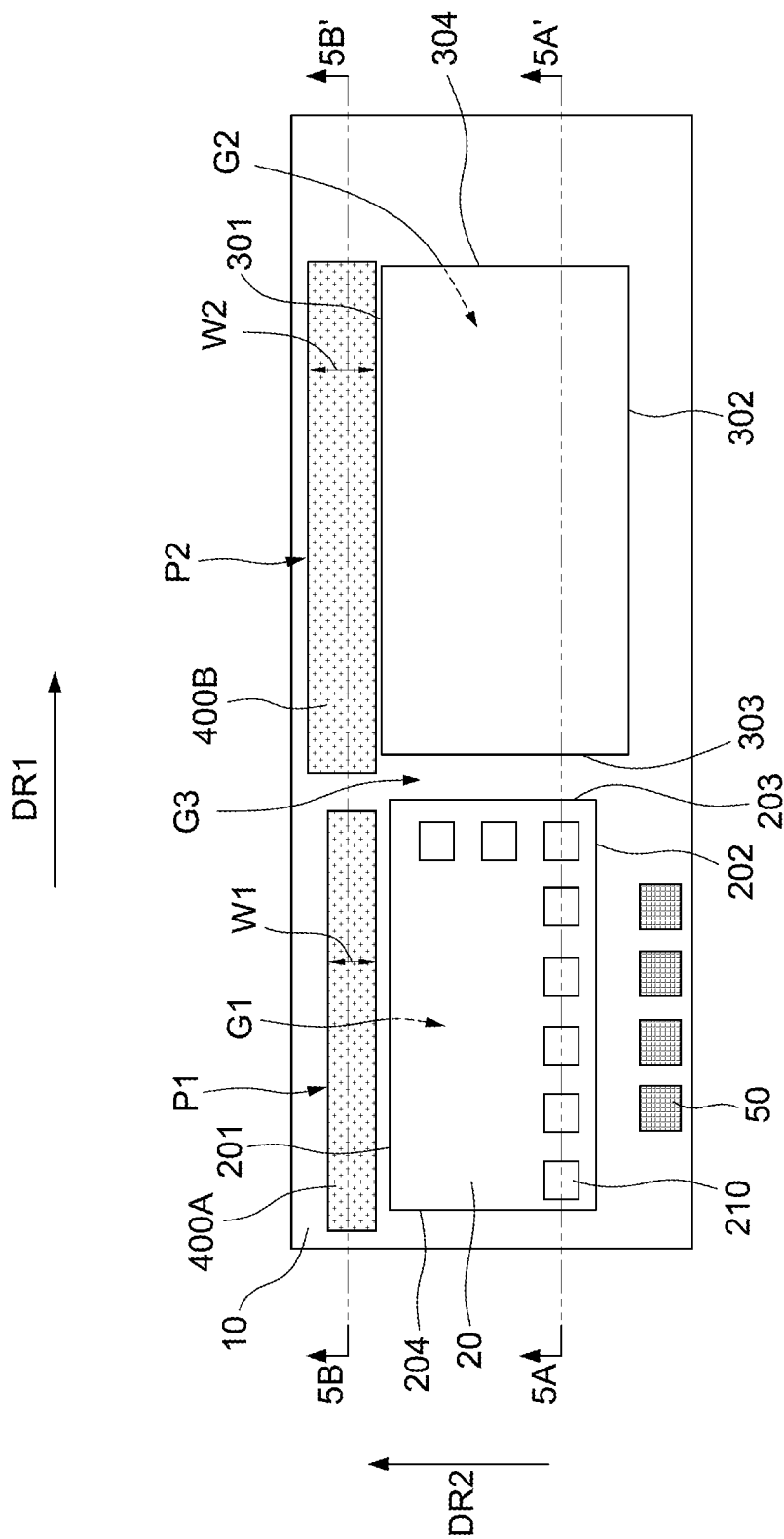
FIG. 5, FIG. 5A, FIG. 5B, FIG. 6, FIG. 6A, FIG. 6B, and FIG. 7 illustrate various operations in a method of manufacturing a semiconductor device package in accordance with some embodiments of the present disclosure.
Figure 5A:
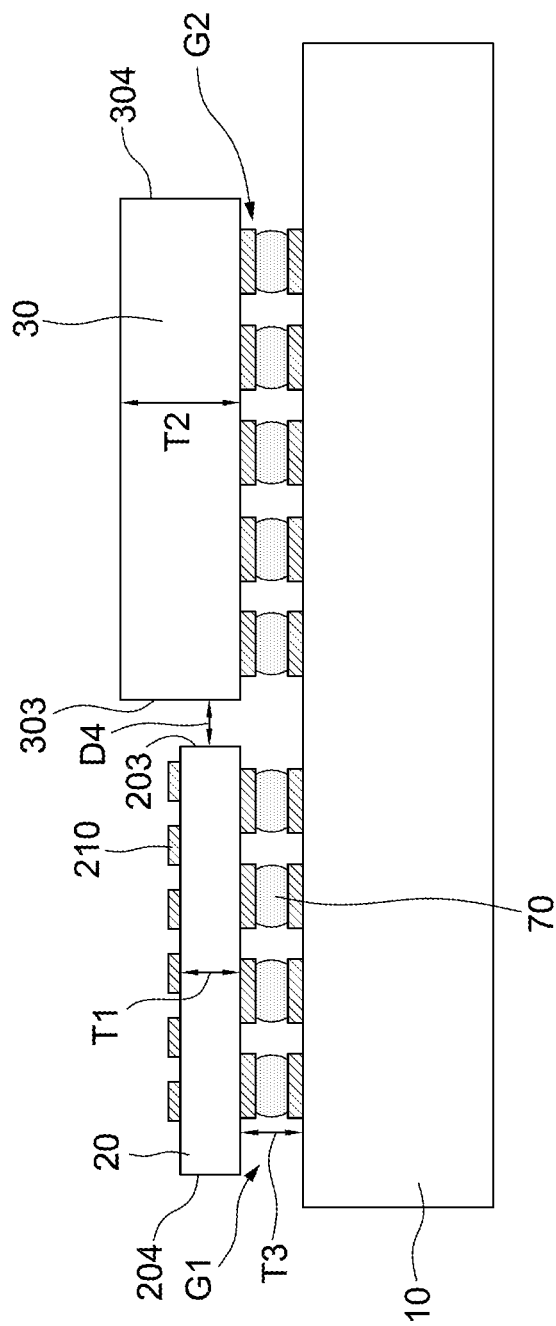
Figure 5B:
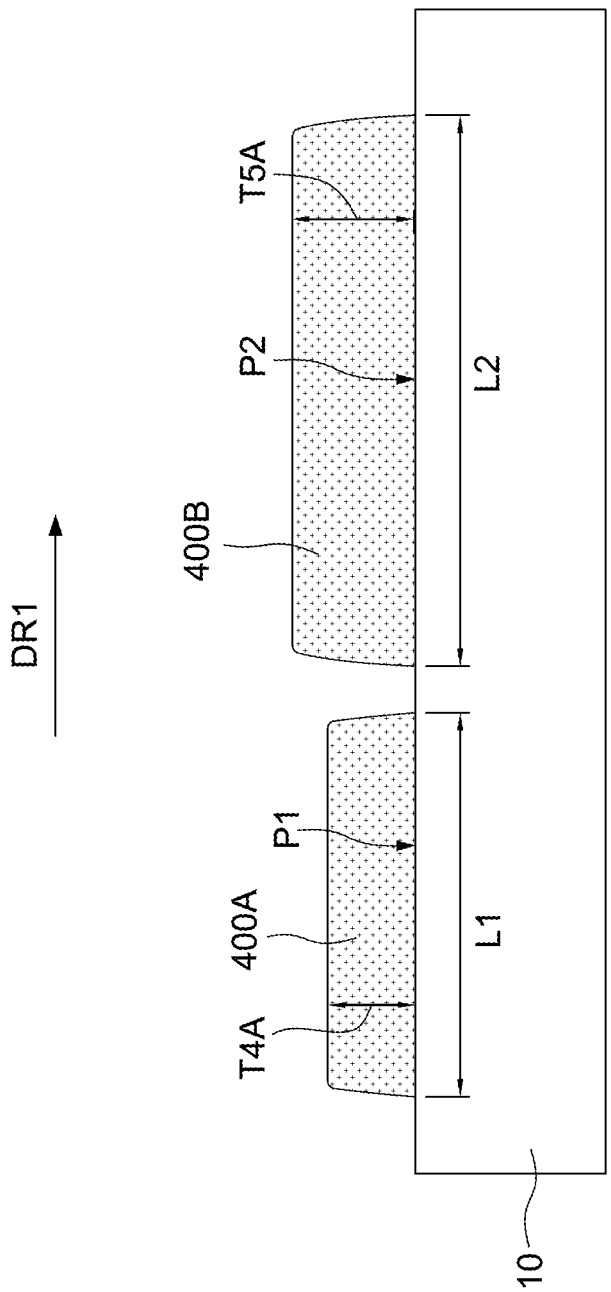

Referring to FIG. 5, FIG. 5A, and FIG. 5B, FIG. 5 is a top view of one or more intermediate stages in a method of manufacturing a semiconductor device package 1 in accordance with some embodiments of the present disclosure, FIG. 5A is a cross-section along line 5A-5A' in FIG. 5, and FIG. 5B is a cross-section along line 5B-5B' in FIG. 5.

Referring to FIG. 5, components 20 and 30 may be bonded to a carrier 10, and one or more protective materials may be applied over the carrier 10 substantially along the direction DR1. In some embodiments, a protective material 400A may be applied towards a gap G1 defined by the component 20 and the carrier 10 from an edge 201 of the component 20, and a protective material 400B may be applied towards a gap G2 defined by the component 30 and the carrier 10 from an edge 301 of the component 30. In some embodiments, at least one conductive pad 50 is formed on the carrier 10 and adjacent to an edge 202 of the component 20. In some embodiments, the protective material 400A and the protective material 400B are applied on predetermined locations of the carrier 10, and the predetermined locations are adjacent to and spaced apart from the edges 201 and 301 of the components 20 and 30, respectively. In some embodiments, the protective material 400A and the protective material 400B are applied from positions (or the predetermined locations) that are adjacent to each other.

Referring to FIG. 5A, a plurality of conductive connection elements 70 may be disposed over the carrier 10 to connect the component 20 and the component 30 to the carrier 10. In some embodiments, the protective material 400A is applied towards a portion (or a group) of the conductive connection elements 70 in the gap G1. In some embodiments, the protective material 400B is applied towards a portion (or a group) of the conductive connection elements 70 in the gap G2. In some embodiments, the protective material 400A and the protective material 400B cover or encapsulate the conductive connection elements 70.

Referring to FIGS. 5 and 5B, the protective material 400A may be applied along a path P1 adjacent to and substantially parallel to the edge 201 of the component 20, and the protective material 400B may be applied along a path P2 adjacent to and substantially parallel to the edge 301 of the component 30. In some embodiments, the path P1 is substantially parallel to the path P2. In some embodiments, an amount of the protective material 400A adjacent to the component 20 is less than an amount of the protective material 400B adjacent to the component 30. In some embodiments, a volume per unit length, an extending length, a width, or a thickness of the protective material 400A applied from the edge 201 of the component 20 is less than a volume per unit length, an extending length, a width, or a thickness of the protective material 400B applied from the edge 301 of the component 30. For example, a thickness T4A of the protective material 400A may be less than a thickness T5A of the protective material 400B. For example, an extending length L1 of the protective material 400A may be less than an extending length L2 of the protective material 400B. For example, a width W1 of the protective material 400A may be less than a width W2 of the protective material 400B. In some embodiments, by varying the force by which applying the protective materials 400A and 400B, the thickness T4A, the width W2, and/or the length L2 of the protective material 400B may be greater than that of the protective material 400A. In some embodiments, the force by which applying the protective materials 400A and 400B may be adjusted by adjusting a pushing force, varying the diameter of the syringe for supplying the protective materials, and the like.

In some embodiments, a thickness T1 of the component 20 is less than a thickness T2 of the component 30, and the protective material 400A is applied prior to applying the protective material 400B. In some embodiments, after the protective material 400A is applied and the conductive connection elements 70 in the gap G1 are covered or encapsulated by the protective material 400A, the protective material 400B is then applied towards the gap G2. In some embodiments, a thickness T1 of the component 20 is less than a thickness T2 of the component 30, and the protective material 400A is applied simultaneously with applying the protective material 400B. In some embodiments, the protective material 400A is applied towards the gap G1, and the protective material 400B is applied towards the gap G2 before the conductive connection elements 70 in the gap G1 are entirely or partially covered or encapsulated by the protective material 400A.

Figure 6:
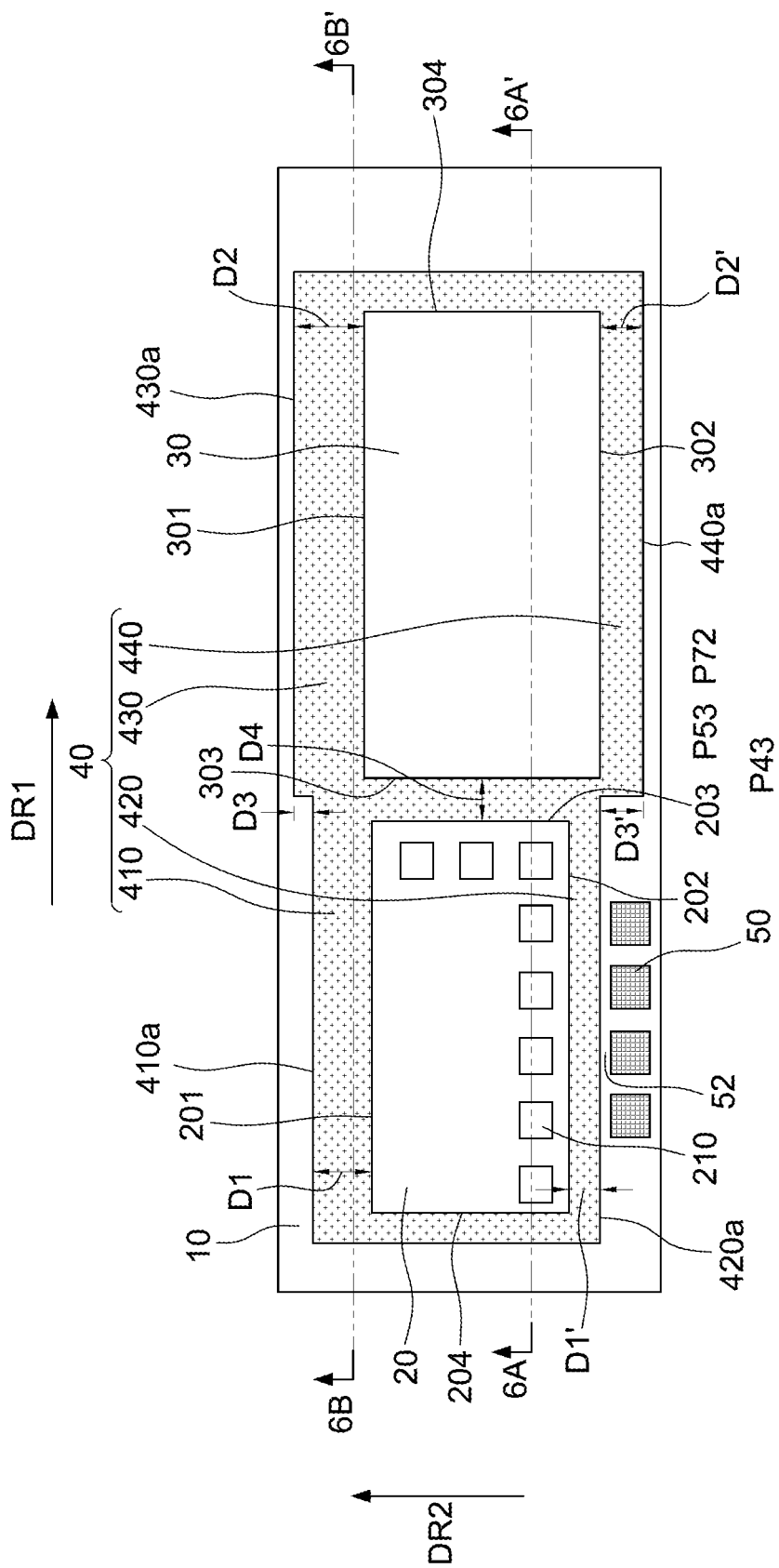
Figure 6A:
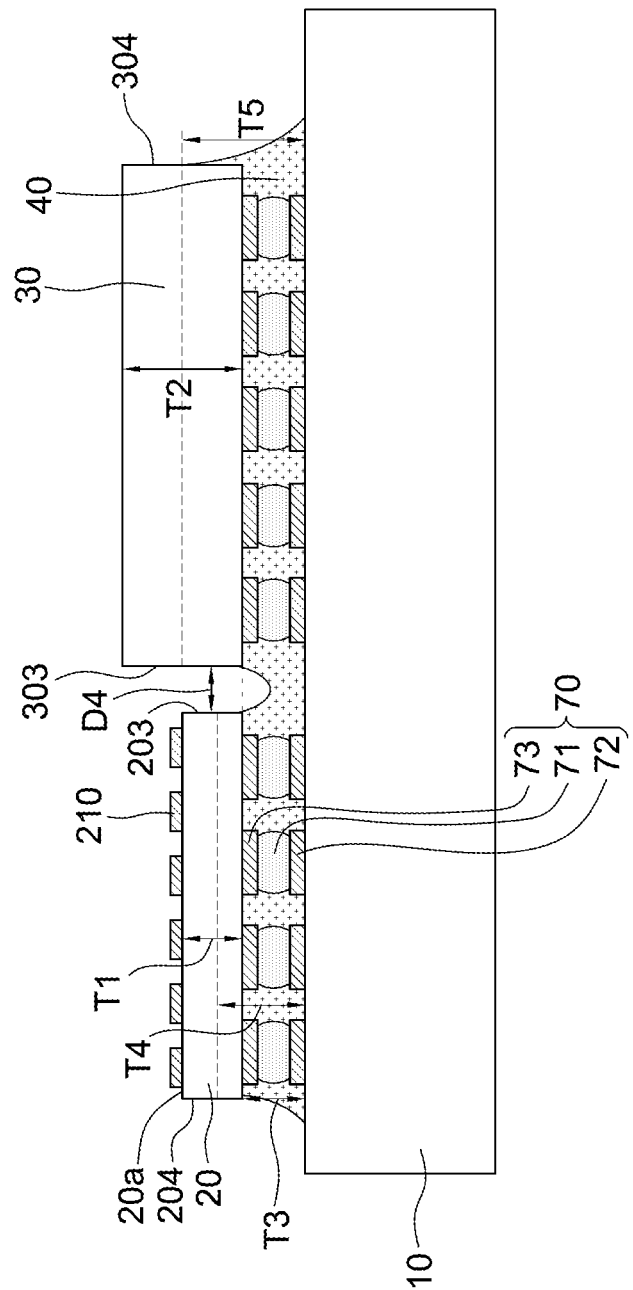
Figure 6B:
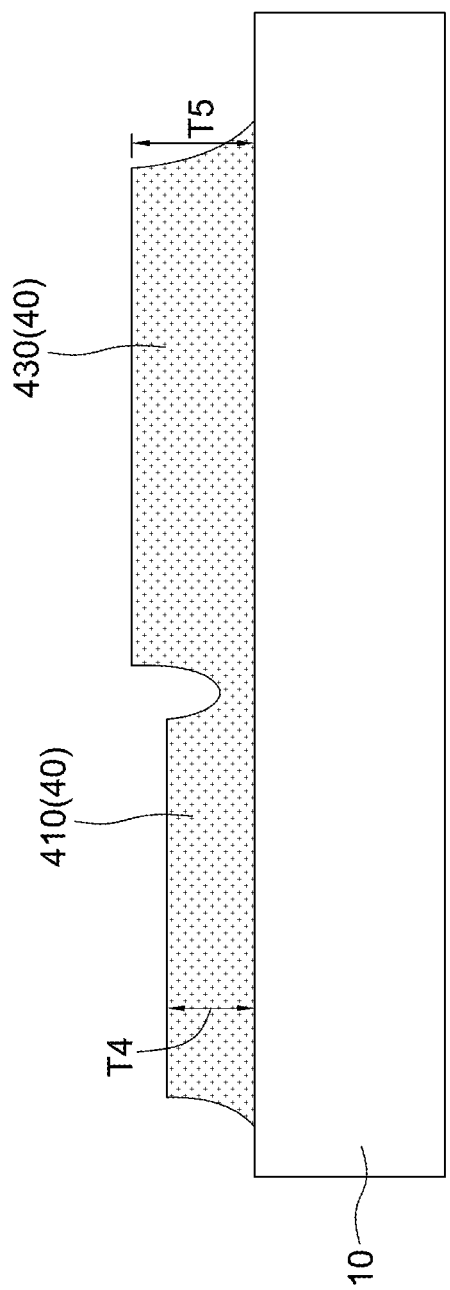

Referring to FIG. 6, FIG. 6A, and FIG. 6B, FIG. 6 is a top view of one or more intermediate stages in a method of manufacturing a semiconductor device package 1 in accordance with some embodiments of the present disclosure, FIG. 6A is a cross-section along line 6A-6A' in FIG. 6, and FIG. 6B is a cross-section along line 6B-6B' in FIG. 6.

Referring to FIG. 6, FIG. 6A, and FIG. 6B, the protective materials 400A and 400B may be cured to form protective element 40. In some embodiments, the protective material 400B contacts the protective material 400A under a gap G3 between the component 20 and the component 30 prior to the curing operation. In some embodiments, the protective materials 400A and 400B are cured after the conductive connection elements 70 are entirely covered or encapsulated by the protective materials 400A and 400B.

In some embodiments, referring to FIG. 5 and FIG. 6, the protective material 400A applied along the path P1 may flow towards the gap G1 and the component 30 prior to the curing operation, and the protective material 400B applied along the path P2 may flow towards the gap G2 and the component 20 prior to the curing operation. In some embodiments, the protective material 400B and the protective material 400A flow towards the gap G3 to form a stepped structure. In some embodiments, the curing operation is performed after the protective material 400B and the protective material 400A flow towards the gap G3 and form the stepped structure, and thus the protective element 40 having stepped step depths D3 and D3' is formed. In some embodiments, after applying the protective material (e.g., the protective materials 400A and 400B) over the carrier 10 substantially along the direction DR1, the protective material flows towards the components 20 and 30 till it reaches or arrives at a location not contacting the conductive pad 50 on the carrier 10. In some embodiments, the protective materials 400A and 400B flow towards the components 20 and 30 and stop before contacting the conductive pads 50 prior to curing the protective materials 400A and 400B. In some embodiments, referring to FIGS. 2A to 2C, a blocking structure (e.g., blocking structures 80A, 80B, and/or 80C) may be disposed between the conductive pads 50 and the component 20 prior to applying the protective materials 400A and 400B. In some embodiments, the blocking structure 80C may be removed after the protective materials 400A and 400B are cured.

Figure 7:
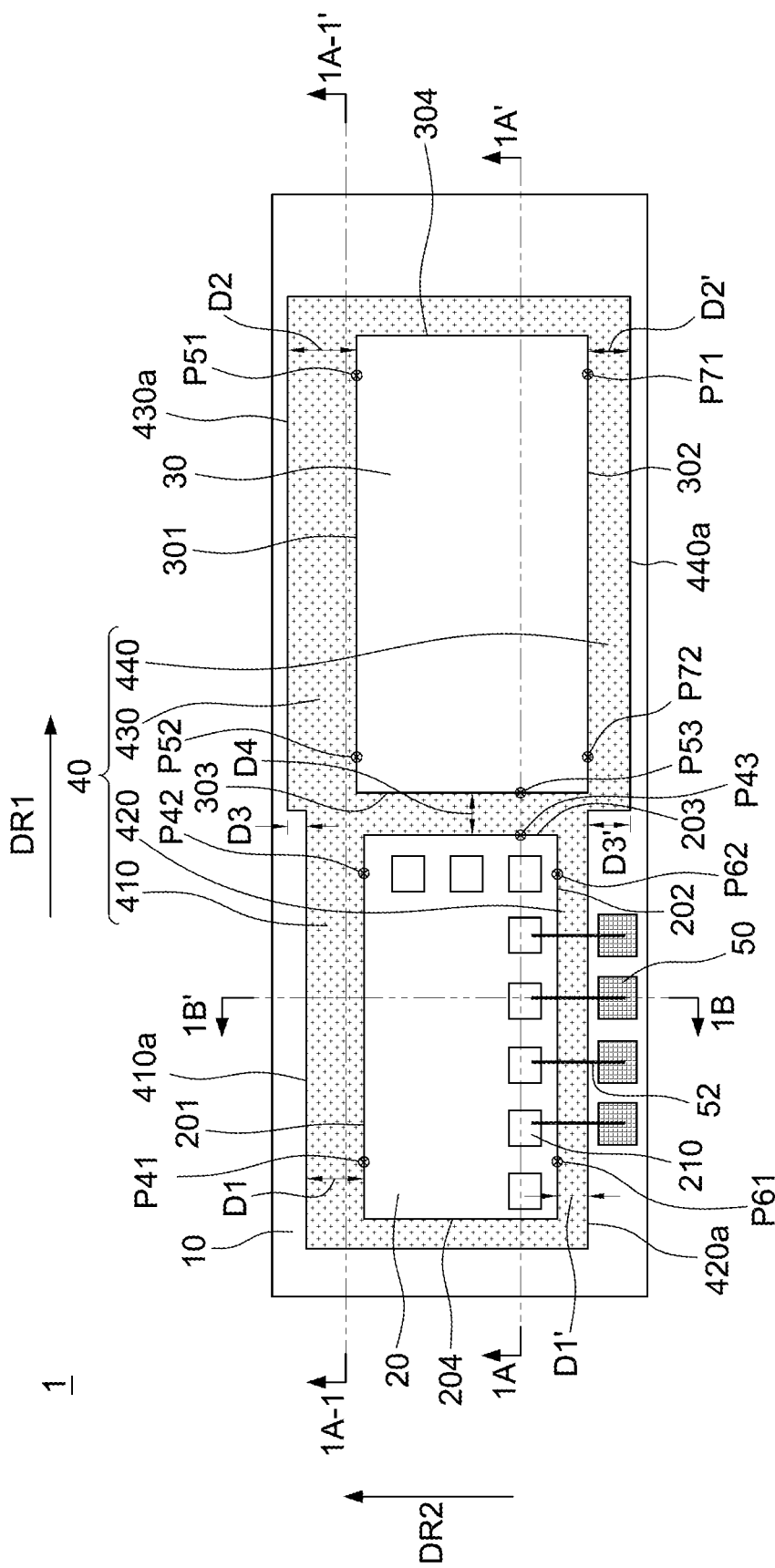

Referring to FIG. 7, one or more bonding wires 52 may be formed to connect the at least one conductive pad 50 to the at least one conductive pad 210. As such, the semiconductor device package 1 is formed.

In some cases where the component 30 having a relatively large thickness is bonded to the carrier 10 through solder balls, an encapsulant is applied to encapsulate the solder balls, and then the component 20 having a relatively small thickness is bonded to the carrier 10 through solder balls which are encapsulated subsequently. When the component 20 is designed to be disposed relatively close to the component 30, the encapsulant applied prior to bonding the component 20 may overflow to the position to which the component 20 is to be bonded, resulting in failure to bond the component 20 to the carrier 10. In order to solve this issue, the solder balls may be encapsulated in a single step after the components 20 and 30 are both bonded to the carrier 10. However, since the component 20 is relatively thin, the encapsulant may overflow to the top surface of the component 20, conductive pads on the top surface of the component 20, and/or conductive pads disposed relatively close to the component 20. This can cause malfunctions of the aforesaid conductive pads.

According to some embodiments of the present disclosure, with the design of applying the protective materials 400A and 400B towards edges 201 and 301 of the components 20 and 30, respectively, the amount of the protective material 400A and the amount of the protective material 400B can be adjusted independently according to thickness, size, and/or position of the components 20 and 30. Therefore, overflowing of the protective material 400B towards the component 20 can be prevented, and thus the yield can be improved.

In addition, according to some embodiments of the present disclosure, the protective material 400A is applied from an edge of the component 20 having a relatively small thickness prior to or simultaneously with applying the protective material 400B from an edge of the component 30 having a relatively small thickness. Therefore, the conductive connection elements 70 under the relatively thin component 20 are encapsulated no later than the conductive connection elements 70 under the relatively thick component 30, and thus it is highly unlikely for the protective material 400A to overflow up to the top surface of the relatively thick component 30. In addition, the amount of the protective material 400B can be adjusted according to the situation of the conductive connection elements 70 and the protective material 400A, which is further advantageous to prevention of undesired overflow of protective materials.

Figure 8:
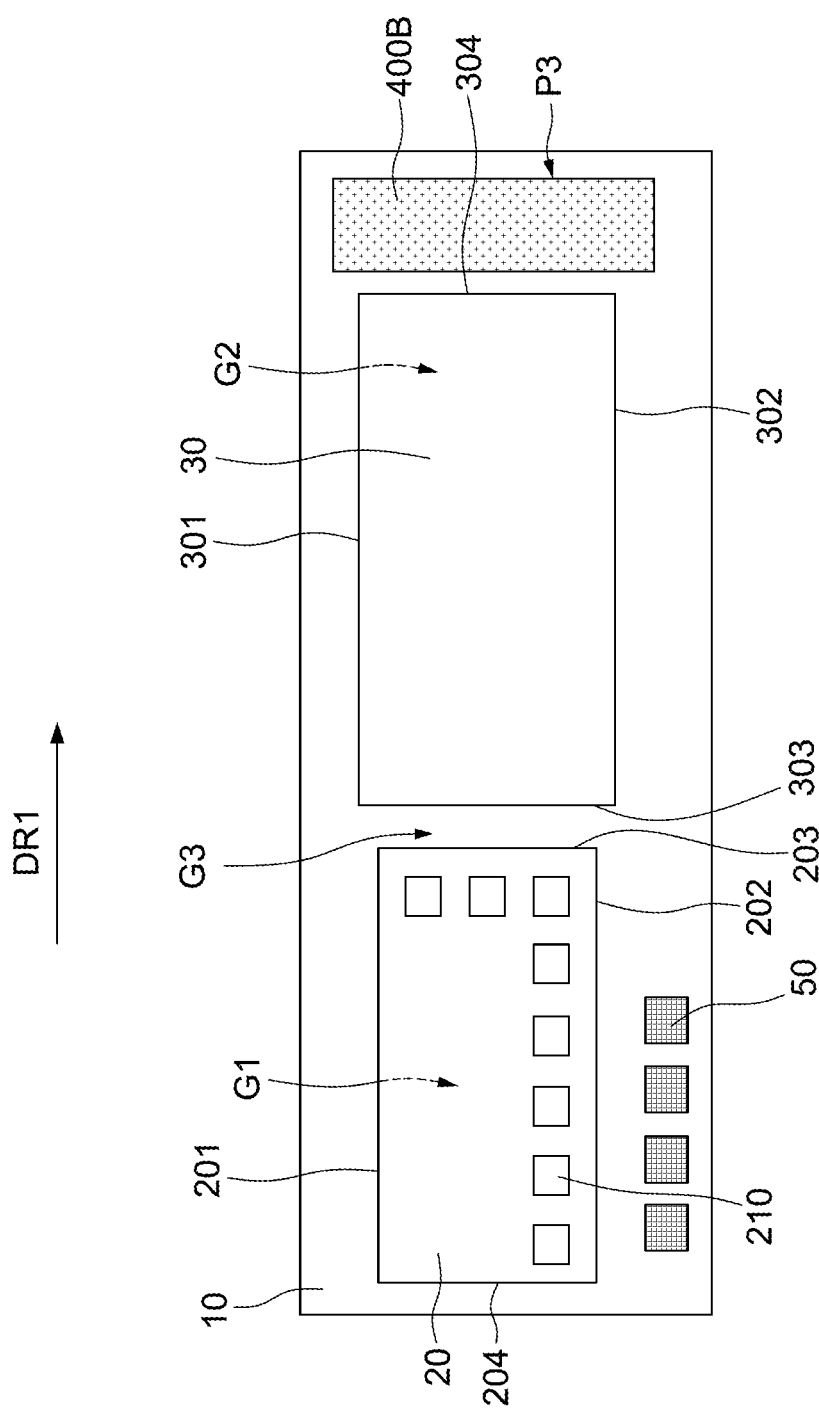
FIG. 8 and FIG. 9 illustrate various operations in a method of manufacturing a semiconductor device package in accordance with some embodiments of the present disclosure.
Figure 9:
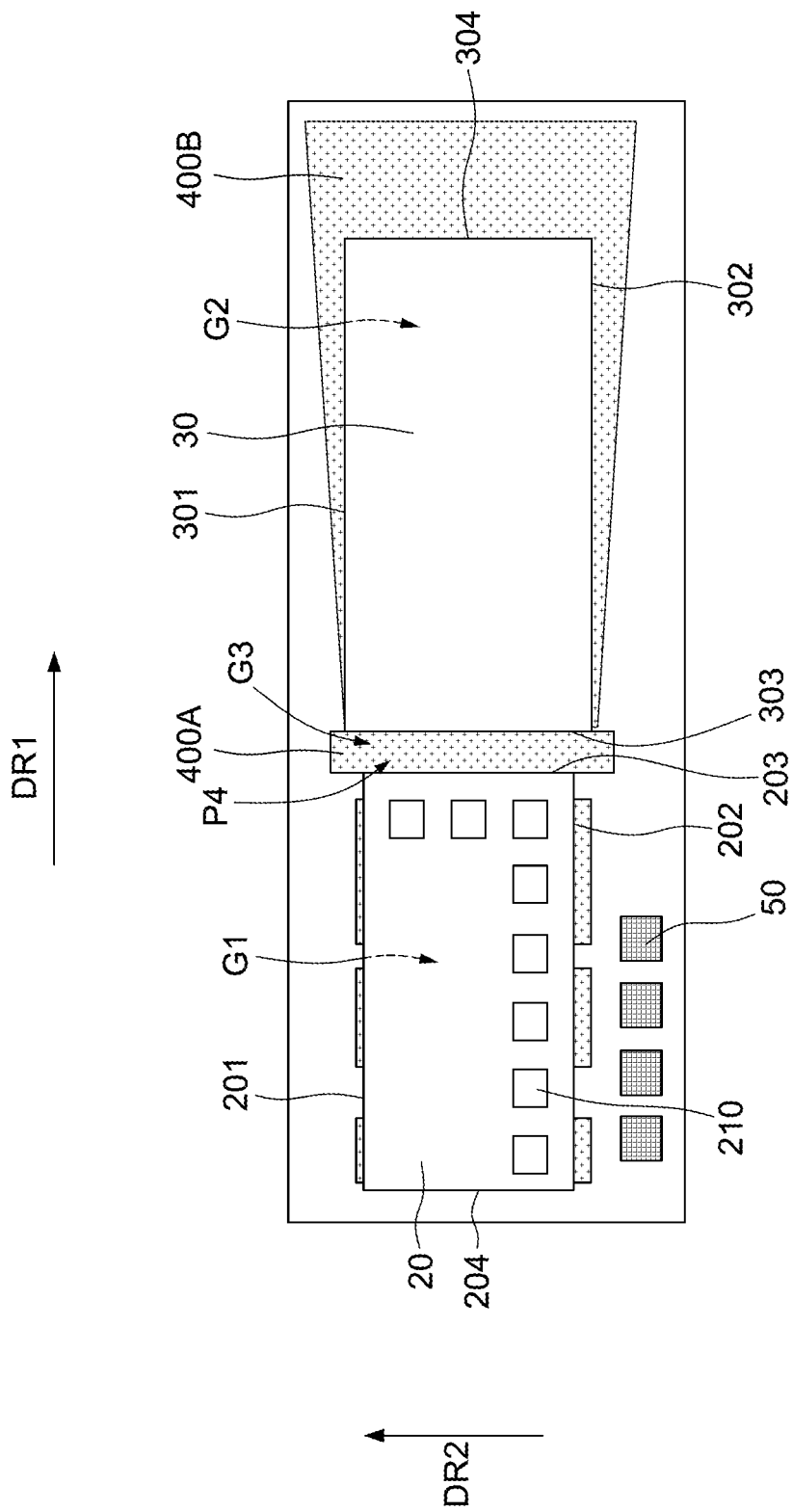

FIG. 8 and FIG. 9 illustrate various operations in a method of manufacturing a semiconductor device package in accordance with some embodiments of the present disclosure. In some embodiments, the operations illustrated in FIGS. 8 and 9 may form the semiconductor device package 1 illustrated in FIG. 1. In some other embodiments, the operations illustrated in FIGS. 8 and 9 may form a semiconductor device package having a structure similar to that of the semiconductor device package 1 but having a protective element 40 with a slightly different structure.

Referring to FIG. 8, components 20 and 30 may be bonded to a carrier 10, and a protective material 400B may be applied towards a gap G2 defined by the component 30 and the carrier 10 from an edge 304 of the component 30. In some embodiments, the protective material 400B is applied on a predetermined location of the carrier 10 adjacent to and spaced apart from the edge 304 of the component 30. In some embodiments, a thickness T1 of the component 20 is less than a thickness T2 of the component 30, and the protective material 400B is applied from a position that is at a side of the component 30 opposite to the component 20. In some embodiments, the protective material 400B may be applied along a path P3 adjacent to and substantially parallel to the edge 304 of the component 30. In some embodiments, the component 30 further has an edge 303 opposite to the edge 304 and facing an edge 203 of the component 20. In some embodiments, one or more conductive pads 50 are formed on the carrier 10 and adjacent to an edge 202 of the component 20 prior to applying the protective material 400B.

In some embodiments, similar to the structure illustrated in FIG. 5A, a plurality of conductive connection elements 70 may be disposed over the carrier 10 to connect the component 20 and the component 30 to the carrier 10. In some embodiments, the protective material 400B is applied towards a portion (or a group) of the conductive connection elements 70 in the gap G2. In some embodiments, the protective material 400B is applied further towards a portion (or a group) of the conductive connection elements 70 in the gap G1.

Referring to FIG. 9, a protective material 400A may be applied towards the gap G1 defined by the component 20 and the carrier 10 from an edge 203 of the component 20. In some embodiments, the protective material 400A is applied on a location of the carrier 10 under a gap G3 between the component 20 and the component 30. In some embodiments, a thickness T1 of the component 20 is less than a thickness T2 of the component 30, and the protective material 400A is applied after applying the protective material 400B. In some embodiments, the protective material 400A may be applied along a path P4 adjacent to and substantially parallel to the edge 203 of the component 20. In some embodiments, the path P3 is substantially parallel to the path P4. In some embodiments, a volume per unit length, an extending length, a width, or a thickness of the protective material 400A applied from the edge 203 of the component 20 is less than a volume per unit length, an extending length, a width, or a thickness of the protective material 400B applied from the edge 304 of the component 30.

In some embodiments, the protective material 400B may further flow towards a portion (or a group) of the conductive connection elements 70 in the gap G1 prior to applying the protective material 400A. In some embodiments, the protective material 400B covers or encapsulates the conductive connection elements 70 in the gap G2 and at least some of the conductive connection elements 70 in the gap G1 prior to applying the protective material 400A. In some embodiments, the protective material 400A covers or encapsulates the conductive connection elements 70 that are not covered or encapsulated by the protective material 400B.

Still referring to FIG. 9, the protective materials 400A and 400B may be cured to form a protective element 40. In some embodiments, the protective materials 400A and 400B are cured after the conductive connection elements 70 are entirely covered or encapsulated by the protective materials 400A and 400B. As such, a semiconductor device structure having a structure the same or similar to that of the semiconductor device structure 1 illustrated in FIG. 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.10, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a carrier;
    a first component and a second component arranged side by side in a first direction over the carrier; and
    a first protective element disposed over a top surface of the carrier and extending from a space under the first component toward a space under the second component,
    wherein the first protective element comprises a first portion and a second portion protruding from opposite edges of the first component by different distances (D1, D1'), and the first portion and the second portion are arranged in a second direction angled with the first direction.

2. The semiconductor device package as claimed in claim 1, wherein the first component is separated from the carrier by a first distance (T3), the first component is separated by the second component by a second distance (D4), and a ratio of the second distance to the first distance is less than about 10.

3. The semiconductor device package as claimed in claim 2, further comprising an interposer electrically connecting the first component to conductive connection elements on the carrier.

4. The semiconductor device package as claimed in claim 1, wherein the first protective element is further disposed between the second component and the carrier, the first protective element further comprises a third portion and a fourth portion protruding from opposite edges of the second component oppositely by different distances (D2, D2') and arranged in the second direction substantially parallel with the first direction in a top view perspective.

5. The semiconductor device package as claimed in claim 4, wherein an edge of the first portion is recessed with respect to an edge of the third portion of the first protective element by a first step depth (D3), and an edge of the second portion is recessed with respect to an edge of the fourth portion of the first protective element by a second step depth (D3') different from the first step depth (D3).

6. The semiconductor device package as claimed in claim 4, wherein the first portion has a thickness (T4) extending from a top surface of the carrier to a top surface of the first portion, the third portion has a thickness (T5) extending from the top surface of the carrier to a top surface of the third portion, and the thickness of the first portion is less than the thickness of the third portion.

7. The semiconductor device package as claimed in claim 6, wherein the second portion has a thickness (T6) extending from the top surface of the carrier to a top surface of the second portion, the thickness (T4) of the first portion is less than the thickness (T6) of the second portion.

8. The semiconductor device package as claimed in claim 1, further comprising:
    a first pad over the carrier and spaced apart from the second portion of the first protective element; and
    a second pad over the first component, wherein the second pad is free from contacting the first protective element.

9. The semiconductor device package as claimed in claim 1, further comprising a third component stacked over the first component, wherein the first protective element is free from contacting the third component.

10. The semiconductor device package as claimed in claim 9, further comprising:
    a plurality of connection elements between the first component and the third component; and
    a second protective element covering the connection elements, wherein the first protective element is free from contacting the second protective element.

11. A semiconductor device package, comprising:
    a carrier;
    a photonic component and an electronic component arranged side by side over the carrier; and
    a protective element comprising a first portion covering a portion of a first edge of the photonic component and a second portion covering a portion of a first edge of the electronic component,
    wherein the first portion has a thickness (T4) extending from a top surface of the carrier to a top surface of the first portion, the second portion has a thickness (T5) extending from the top surface of the carrier to a top surface of the second portion, and the thickness of the first portion is less than the thickness of the second portion.

12. The semiconductor device package as claimed in claim 11, wherein the first portion comprises a first part adjacent to the electronic component and a second part distal from the electronic component, the first part has a thickness (T4') extending from the top surface of the carrier to a top surface of the first part, the second part has a thickness (T4) extending from the top surface of the carrier to a top surface of the second part, and the thickness (T4') of the first part is greater than the thickness (T4) of the second part.

13. The semiconductor device package as claimed in claim 12, wherein the second portion comprises a third part adjacent to the photonic component and a fourth part distal from the photonic component, the third part has a thickness (T5') extending from the top surface of the carrier to a top surface of the third part, the fourth part has a thickness (T5) extending from the top surface of the carrier to a top surface of the fourth part, and the thickness (T5') of the third part is less than the thickness (T5) of the fourth part.

14. The semiconductor device package as claimed in claim 13, wherein the first part of the first portion of the protective element is adjacent to an edge of the photonic component, the third part of the second portion of the protective element is adjacent to an edge of the electronic component, and the thickness (T5') of the third part is greater than the thickness (T4') of the first part.

15. The semiconductor device package as claimed in claim 11, wherein the first portion of the protective element protrudes outwards from a left edge of the photonic component towards a left edge of the carrier by a first distance (D1), and the second portion of the protective element protrudes outwards from a right edge of the electronic component towards a right edge of the carrier by a second distance (D2) greater than the first distance (D1).

16. The semiconductor device package as claimed in claim 11, wherein the photonic component has a first thickness, and the electronic component has a second thickness greater than the first thickness.

17. The semiconductor device package as claimed in claim 16, wherein a first gap defined by the carrier and the photonic component is smaller than a second gap defined by the carrier and the electronic component.

18. The semiconductor device package as claimed in claim 17, wherein an elevation of a bottom surface of the electronic component is between an elevation of a top surface of the photonic component and an elevation of a bottom surface of the photonic component.

19. The semiconductor device package as claimed in claim 11, wherein the first portion and the second portion directly contact each other and collectively form a first stepped structure in a top view perspective, and an edge of the first portion is recessed with respect to an edge of the second portion by a first step depth.

20. The semiconductor device package as claimed in claim 19, wherein the protective element further comprises:
  a third portion covering a portion of a second edge opposite to the first edge of the photonic component; and
  a fourth portion covering a portion of a second edge opposite to the first edge of the electronic component,
  wherein the third portion and the fourth portion directly contact each other and collectively form a second stepped structure in the top view perspective, and an edge of the third portion is recessed with respect to an edge of the fourth portion by a second step depth different from the first step depth.

\* \* \* \* \*